(12) United States Patent
Shimotsusa

(10) Patent No.: US 9,082,820 B2
(45) Date of Patent: Jul. 14, 2015

(54) MANUFACTURING METHOD OF SEMICONDUCTOR APPARATUS

(71) Applicant: CANON KABUSHIKI KAISHA, Tokyo (JP)

(72) Inventor: Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/038,484

(22) Filed: Sep. 26, 2013

(65) Prior Publication Data

US 2014/0094030 A1    Apr. 3, 2014

(30) Foreign Application Priority Data

Sep. 28, 2012 (JP) ................. 2012-215969

(51) Int. Cl.
| | | |
|---|---|---|
| H01L 21/44 | (2006.01) | |
| H01L 21/768 | (2006.01) | |
| H01L 23/00 | (2006.01) | |
| H01L 23/48 | (2006.01) | |
| H01L 27/146 | (2006.01) | |

(52) U.S. Cl.
CPC ........ *H01L 21/768* (2013.01); *H01L 21/76898* (2013.01); *H01L 23/481* (2013.01); *H01L 24/05* (2013.01); *H01L 27/1464* (2013.01); *H01L 27/1469* (2013.01); *H01L 27/14623* (2013.01); *H01L 27/14627* (2013.01); *H01L 27/14634* (2013.01); *H01L 27/14636* (2013.01); *H01L 27/14638* (2013.01); *H01L 2224/48463* (2013.01); *H01L 2924/13091* (2013.01)

(58) Field of Classification Search
None
See application file for complete search history.

(56) References Cited

U.S. PATENT DOCUMENTS

| | | |
|---|---|---|
| 6,309,960 B1 | 10/2001 | Sukekawa |
| 8,742,524 B2 | 6/2014 | Itonaga et al. |
| 8,853,852 B2 | 10/2014 | Hayashi |
| 2008/0057615 A1 | 3/2008 | Okagawa et al. |
| 2009/0267185 A1 | 10/2009 | Osada et al. |
| 2010/0238331 A1 | 9/2010 | Umebayashi et al. |

(Continued)

FOREIGN PATENT DOCUMENTS

| | | |
|---|---|---|
| JP | 63-150941 A | 6/1988 |
| JP | 2000-277610 A | 10/2000 |

(Continued)

OTHER PUBLICATIONS

U.S. Appl. No. 14/038,516, filed Sep. 26, 2013, Mineo Shimotsusa.

*Primary Examiner* — Yasser A Abdelaziez

(74) *Attorney, Agent, or Firm* — Canon U.S.A., Inc. IP Division

(57) ABSTRACT

A first wiring part has an intermediate layer made of a material different from materials of a first insulator layer and a first conductor layer and located between the first insulator layer and the first conductor layer. In a step of forming a first hole, which penetrates through a first element part and the first insulator layer, from a side of a first semiconductor layer toward the first conductor layer, and forming a second hole, which penetrates through the first element part, the first wiring part, and a second insulator layer, from the side toward the second conductor layer, an etching condition of the first insulator layer when the first hole is formed is that an etching rate for the material of the first insulator layer under the etching condition is higher than an etching rate for the material of the intermediate layer under the etching condition.

11 Claims, 12 Drawing Sheets

(56) References Cited

U.S. PATENT DOCUMENTS

| | | |
|---|---|---|
| 2011/0102657 A1* | 5/2011 | Takahashi et al. ............ 348/308 |
| 2011/0233702 A1* | 9/2011 | Takahashi et al. ............ 257/432 |
| 2011/0298021 A1 | 12/2011 | Tada et al. |
| 2012/0049306 A1 | 3/2012 | Ohba et al. |
| 2012/0062777 A1 | 3/2012 | Kobayashi et al. |
| 2012/0086094 A1 | 4/2012 | Watanabe |
| 2012/0256319 A1 | 10/2012 | Mitsuhashi |
| 2013/0020468 A1 | 1/2013 | Mitsuhashi et al. |
| 2013/0057699 A1 | 3/2013 | Ooki |
| 2013/0082341 A1 | 4/2013 | Shimizu et al. |
| 2014/0252527 A1 | 9/2014 | Sato |

FOREIGN PATENT DOCUMENTS

| | | |
|---|---|---|
| JP | 2009-266918 A | 11/2009 |
| JP | 2010-027695 A | 2/2010 |
| JP | 2010-245506 A | 10/2010 |
| JP | 2011-096851 A | 5/2011 |
| JP | 2011-151375 A | 8/2011 |
| JP | 2011-258687 A | 12/2011 |

* cited by examiner

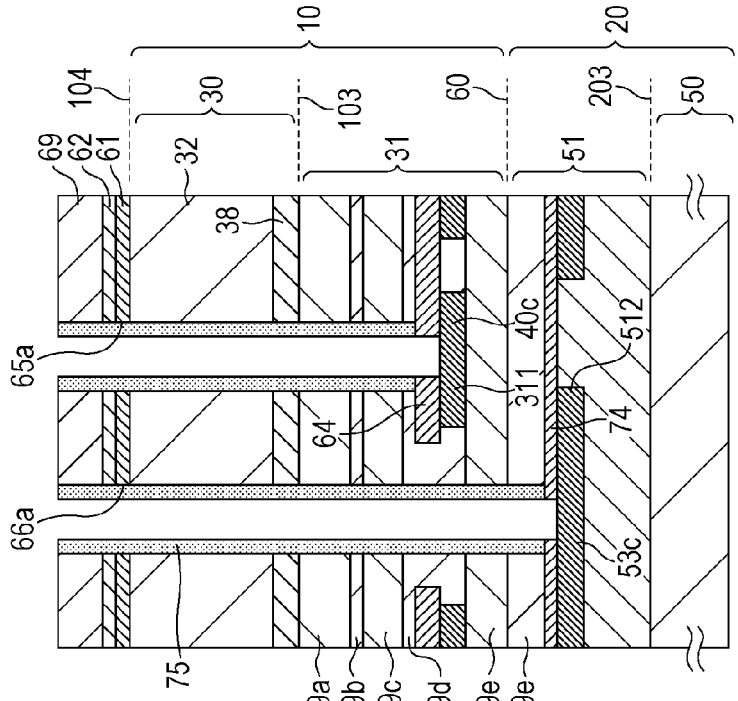
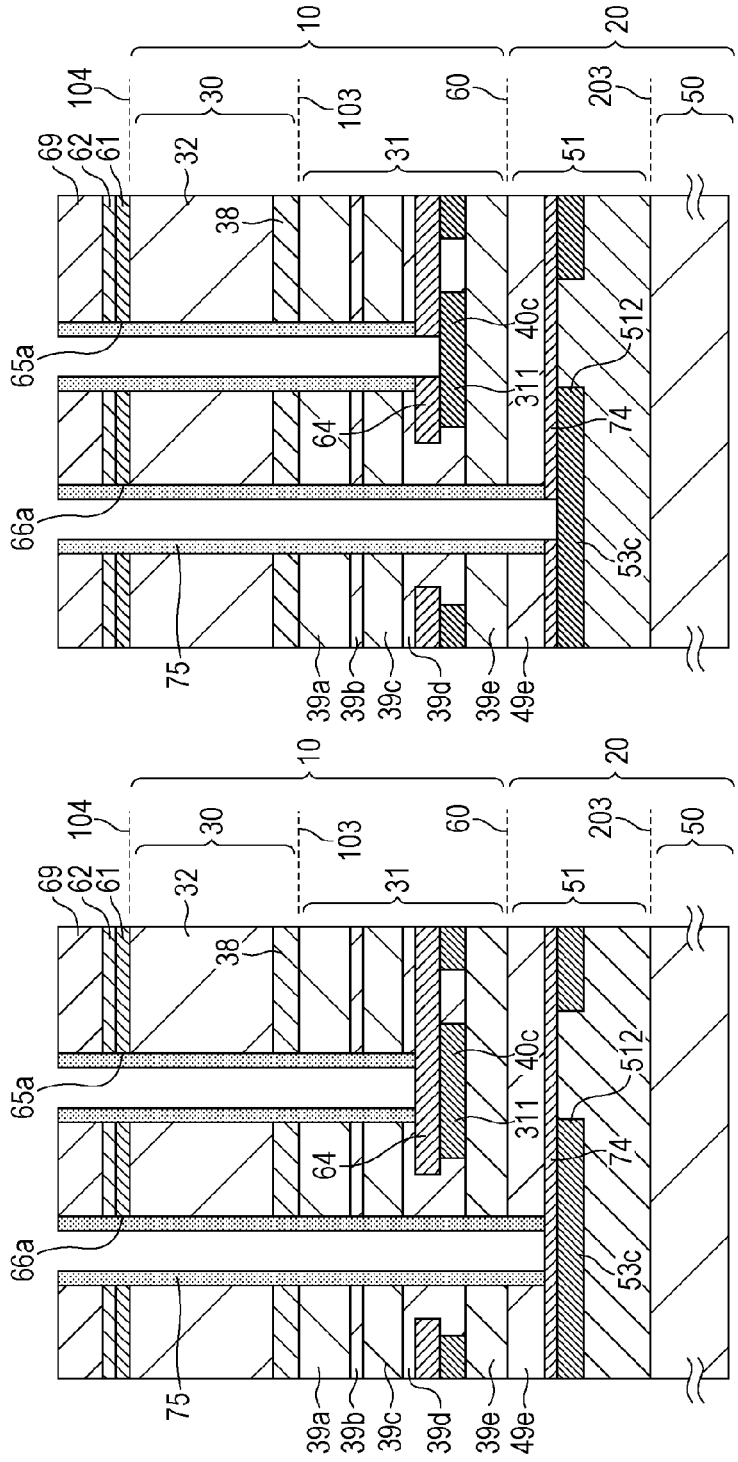

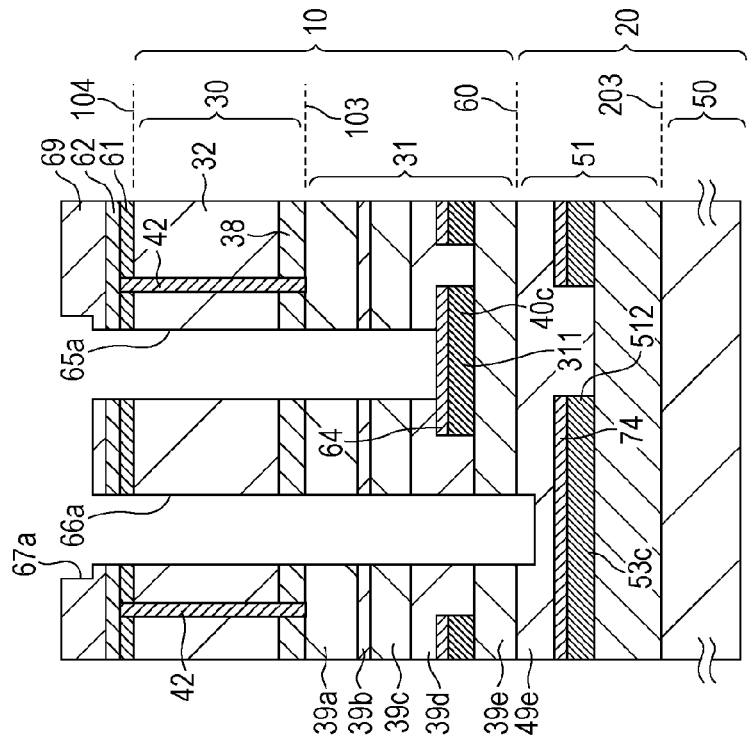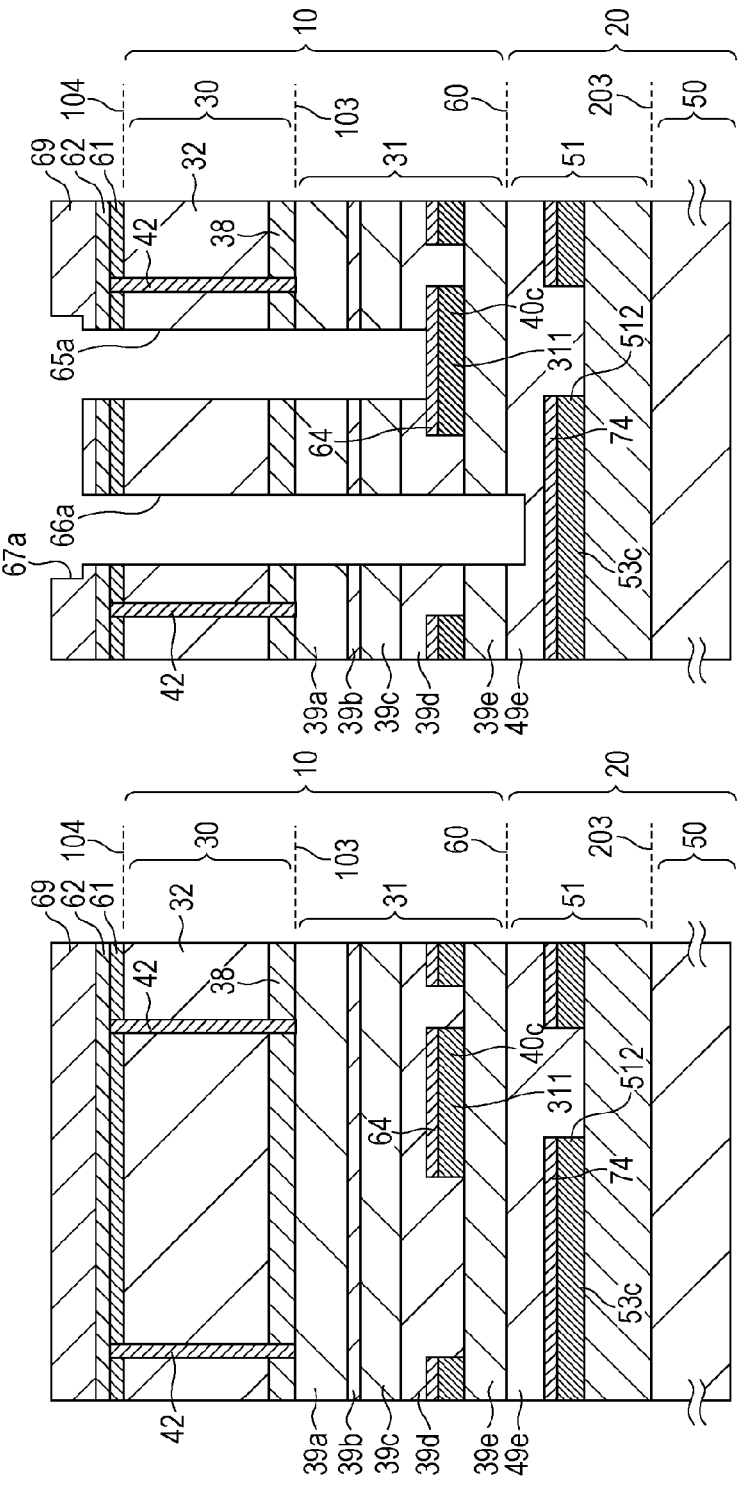
FIG. 7A
FIG. 7B

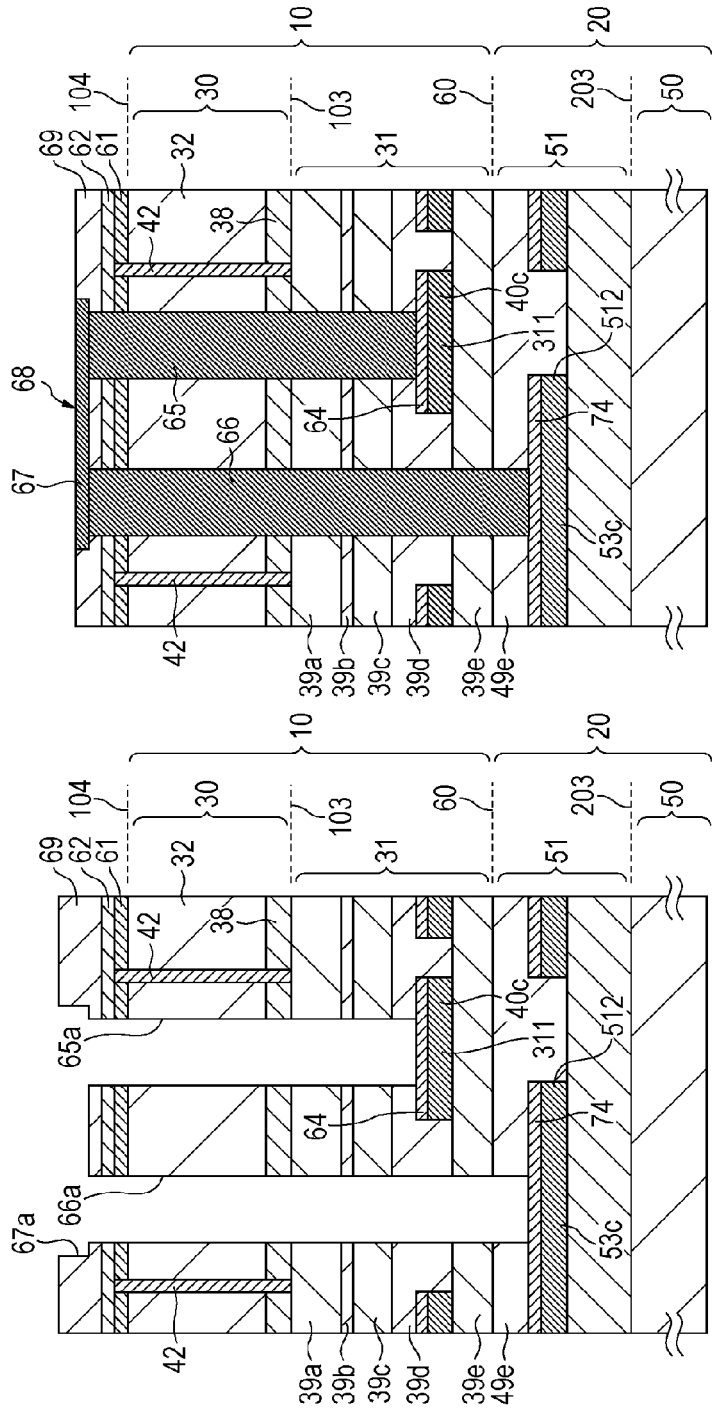

MANUFACTURING METHOD OF SEMICONDUCTOR APPARATUS

BACKGROUND OF THE INVENTION

1. Field of the Invention

The present technology relates to a semiconductor apparatus including a plurality of semiconductor parts.

2. Description of the Related Art

In a photoelectric conversion apparatus such as a complementary metal-oxide semiconductor (CMOS) image sensor which is a type of semiconductor apparatus, a photoelectric conversion unit having a plurality of photoelectric conversion elements and a signal processing unit that processes an electric signal from the photoelectric conversion unit are built onto a single semiconductor substrate in a monolithic manner. A structure is being studied in which the photoelectric conversion unit and the signal processing unit are formed on individual parts (chips), the parts are stacked on each other, and the parts are electrically connected with each other through a conductive member. Accordingly, an occupied area (a footprint) of the photoelectric conversion apparatus in electronic equipment on which the photoelectric conversion apparatus is mounted can be efficiently utilized. The conductive member is provided to obtain the electrical connection between the parts. Such a structure may be applied to any of various semiconductor apparatuses that realize so-called system-in packages.

Japanese Patent Laid-Open No. 2011-096851 describes that inter-substrate wiring (68) is provided as the conductive member for obtaining the electrical connection between semiconductor substrates (31, 45) corresponding to the parts. In Japanese Patent Laid-Open No. 2011-096851, the inter-substrate wiring is formed as follows. First, a first groove (64) is formed, and a second groove (65) is formed by making an opening in a bottom region of the first groove (64) to a depth immediately in front of aluminum wiring (57). Then, a third groove (66) is formed by making an opening to a depth immediately in front of copper wiring (40). Then, the bottom of the second groove and the bottom of the third groove are further removed by etching, so that the aluminum wiring and the copper wiring are exposed.

With the forming method of the inter-substrate wiring described in Japanese Patent Laid-Open No. 2011-096851, when the openings are made in the second groove and the third groove to the depths immediately in front of the aluminum wiring and the copper wiring, a difference may be generated between the thickness of a remaining insulator to the aluminum wiring and the thickness of a remaining insulator to the copper wiring. The difference may cause a connection failure to be generated due to insufficient etching of the insulators, and damage and metal contamination on the wiring to be generated due to excessive etching of the conductors (the wiring) when the bottoms of the second and third grooves are etched. This technology addresses the problems and increases reliability of electrical connection by a conductive member.

SUMMARY OF THE INVENTION

To address the problems, there is provided a manufacturing method of a semiconductor apparatus including preparing a laminated body including a first element part having a first semiconductor layer, a first wiring part having a first conductor layer, and a first insulator layer located between the first semiconductor layer and the first conductor layer, a second element part including a second semiconductor layer, and a second wiring part including a second conductor layer, in which the second wiring part is located between the first element part and the second element part, the first wiring part is located between the first element part and the second wiring part, and a second insulator layer is located between the first conductor layer and the second conductor layer; forming a first hole, which penetrates through the first element part and the first insulator layer, from a side of the first semiconductor layer toward the first conductor layer, and forming a second hole, which penetrates through the first element part, the first wiring part, and the second insulator layer, from the side of the first semiconductor layer toward the second conductor layer; and forming a conductive member configured to electrically connect the first conductor layer with the second conductor layer, in the first hole and the second hole. The first wiring part has an intermediate layer made of a material different from materials of the first insulator layer and the first conductor layer and located between the first insulator layer and the first conductor layer. An etching condition of the first insulator layer when the first hole is formed is that an etching rate for the material of the first insulator layer under the etching condition is higher than an etching rate for the material of the intermediate layer under the etching condition.

Further features of the present invention will become apparent from the following description of exemplary embodiments with reference to the attached drawings.

BRIEF DESCRIPTION OF THE DRAWINGS

FIGS. 3A-1, 3A-2, and 3B are schematic illustrations showing an example of a manufacturing method of the semiconductor apparatus.

FIGS. 6A to 6D are schematic illustrations showing another example of a manufacturing method of a semiconductor apparatus.

FIGS. 7A to 7D are schematic illustrations showing still another example of a manufacturing method of a semiconductor apparatus.

DESCRIPTION OF THE EMBODIMENTS

Embodiments are described below with reference to the drawings. In the following description, a plurality of mutually related drawings may be referenced. Also, common reference signs are applied to equivalent or similar configurations. Redundant description for the configuration applied with the common reference sign is occasionally omitted.

First Embodiment

Figure 1A:
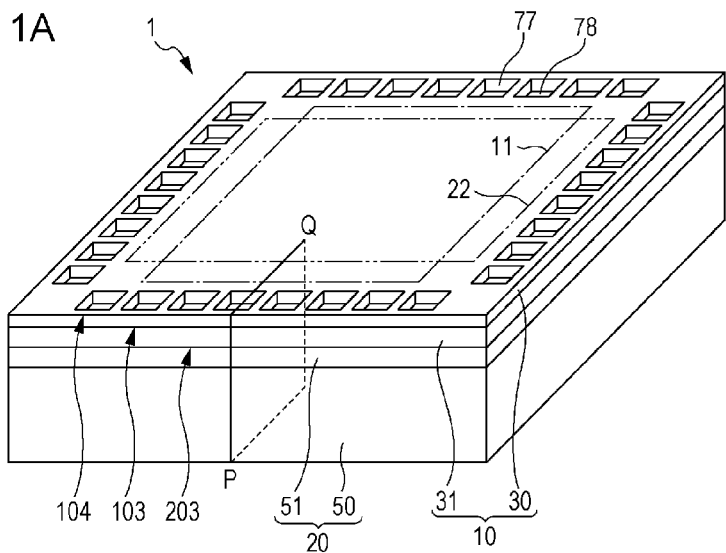
FIGS. 1A to 1D are schematic illustrations showing an example of a semiconductor apparatus.
Figure 1B:
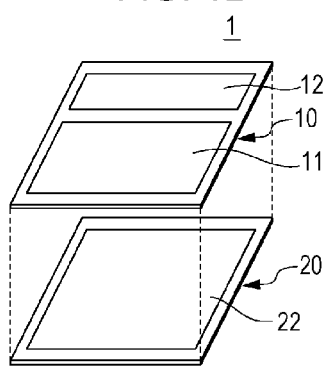
Figure 1C:
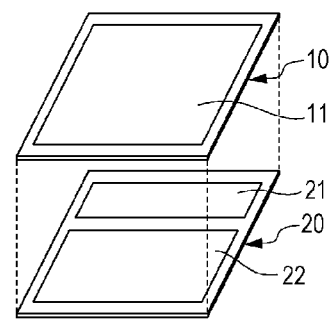
Figure 1D:
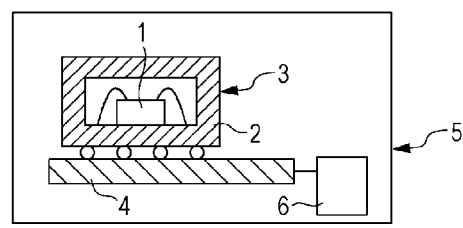

A photoelectric conversion apparatus serving as an example of a semiconductor apparatus according to this embodiment is described with reference to FIGS. 1A to 1D. FIG. 1A is a perspective view of a semiconductor device 1 which is a primary portion of the semiconductor apparatus. FIGS. 1B and 1C are exploded perspective views of an example of the semiconductor device 1. FIG. 1D is a schematic illustration of electronic equipment 5 including a semiconductor apparatus 3 including the semiconductor device 1.

In the semiconductor device 1 shown in FIG. 1A, a first section 10 is stacked on a second section 20 as shown in FIG. 1B or 1C. This embodiment mainly relates to a conductive member for obtaining electrical connection between the first section 10 and the second section 20. As shown in FIG. 1A, the first section 10 includes a first element part 30 and a first wiring part 31. The second section 20 includes a second element part 50 and a second wiring part 51. The second wiring part 51 is located between the first section 10 and the second element part 50. That is, the second wiring part 51 is located between the first element part 30 and the second element part 50, and the second wiring part 51 is located between the first wiring part 31 and the second element part 50. In this embodiment, the first wiring part 31 is located between the first element part 30 and the second section 20; however, the first element part 30 may be located between the first wiring part 31 and the second section 20.

In this embodiment, the first section 10 includes a photoelectric conversion unit 11. The photoelectric conversion unit 11 includes a photoelectric conversion element that generates a signal carrier in accordance with incident light. The photoelectric conversion unit 11 may include a signal generation circuit that generates an electric signal based on the signal carrier generated by the photoelectric conversion element. The signal generation circuit includes, for example, an amplification transistor, a transfer transistor, a reset transistor, and a selection transistor. A photoelectric conversion unit 11 of another example may include a photoelectric conversion element and a charge coupled device (CCD) that transfers a signal carrier.

In this embodiment, the second section 20 includes a signal processing unit 22. The signal processing unit 22 processes the electric signal based on the signal carrier generated by the photoelectric conversion unit 11. The signal processing unit 22 may include a noise reduction circuit, an amplification circuit, a conversion circuit, and an image processing circuit. The noise reduction circuit is, for example, a correlated double sampling (CDS) circuit. The amplification circuit is, for example, a column amplification circuit. The conversion circuit is, for example, an analog digital converter (ADC) circuit including a comparator and a counter. The image processing circuit includes, for example, a memory and a processor. The image processing circuit generates image data from a digital signal after analog-digital conversion, and performs image processing on image data.

FIG. 1A illustrates the position of the photoelectric conversion unit 11 by surrounding it with a single-dot chain line, and the position of the signal processing unit 22 by surrounding it with a two-dot chain line. The signal processing unit 22 is located in an orthogonal projection region of the photoelectric conversion unit 11 to the second section 20. The signal processing unit 22 may be arranged inside and outside the orthogonal projection region of the photoelectric conversion unit 11. A portion of the signal processing unit 22 may be provided at the first section 10. For example, a signal processing unit for analog signals, such as the noise reduction circuit, and the amplification circuit, may be provided at the first section 10 and a signal processing unit for digital signals, such as the conversion circuit and the image processing circuit, may be provided at the second section 20.

As shown in FIGS. 1B and 1C, the semiconductor device 1 may further include a control unit 12 that controls the photoelectric conversion unit 11, and/or a control unit 21 that controls the signal processing unit 22. The control units may be provided at at least one of the first section 10 and the second section 20. In the example shown in FIG. 1B, the control unit 12 is provided at the first section 10. In the example shown in FIG. 1C, the control unit 21 is provided at the second section 20. Alternatively, the control unit for the photoelectric conversion unit 11 may be provided at the first section 10, and the control unit for the signal processing unit 22 may be provided at the second section 20. The control unit 12 may include a vertical driving circuit that supplies a pixel circuit with a driving signal through a vertical scanning line, and may include a power supply circuit. The control unit 21 may include a timing generation circuit that drives the signal processing unit 22, a reference-signal supply circuit that supplies the conversion circuit with a reference signal, and a horizontal scanning circuit that successively reads signals from the amplification circuit or the conversion circuit.

As shown in FIG. 1D, the semiconductor apparatus 3 may include a package 2 as a mounting member for first mounting of the semiconductor device 1. The semiconductor device 1 may be bonded to the package by die bonding, and may be housed in the package. The package 2 may include an external terminal, such as a ping grid array (PGA), a land grind array (LGA), a ball grid array (BGA), or a lead frame. As shown in FIG. 1D, the semiconductor apparatus 3 may include a circuit board 4 as a mounting member for second mounting. The package 2 may be mounted on the circuit board 4. The circuit board 4 may be a printed circuit board, which is a rigid substrate, a flexible substrate, or a rigid-flexible substrate. The semiconductor apparatus 3 serving as the photoelectric conversion apparatus may be a camera module including an optical system that guides light to the semiconductor device 1.

The semiconductor apparatus 3 may be mounted on any type of electronic equipment. Electronic equipment 5 includes peripheral devices 6, such as an arithmetic operation device, a memory device, a record device, a communication device, and a display device, in addition to the semiconductor apparatus 3. The peripheral devices are connected to the semiconductor apparatus 3, and directly or indirectly exchange signals. The electronic equipment 5 may be an information terminal, such as a mobile phone or a personal computer; or an image device, such as a camera or a display. Of course, an information terminal equipped with a camera is included.

Figure 2:
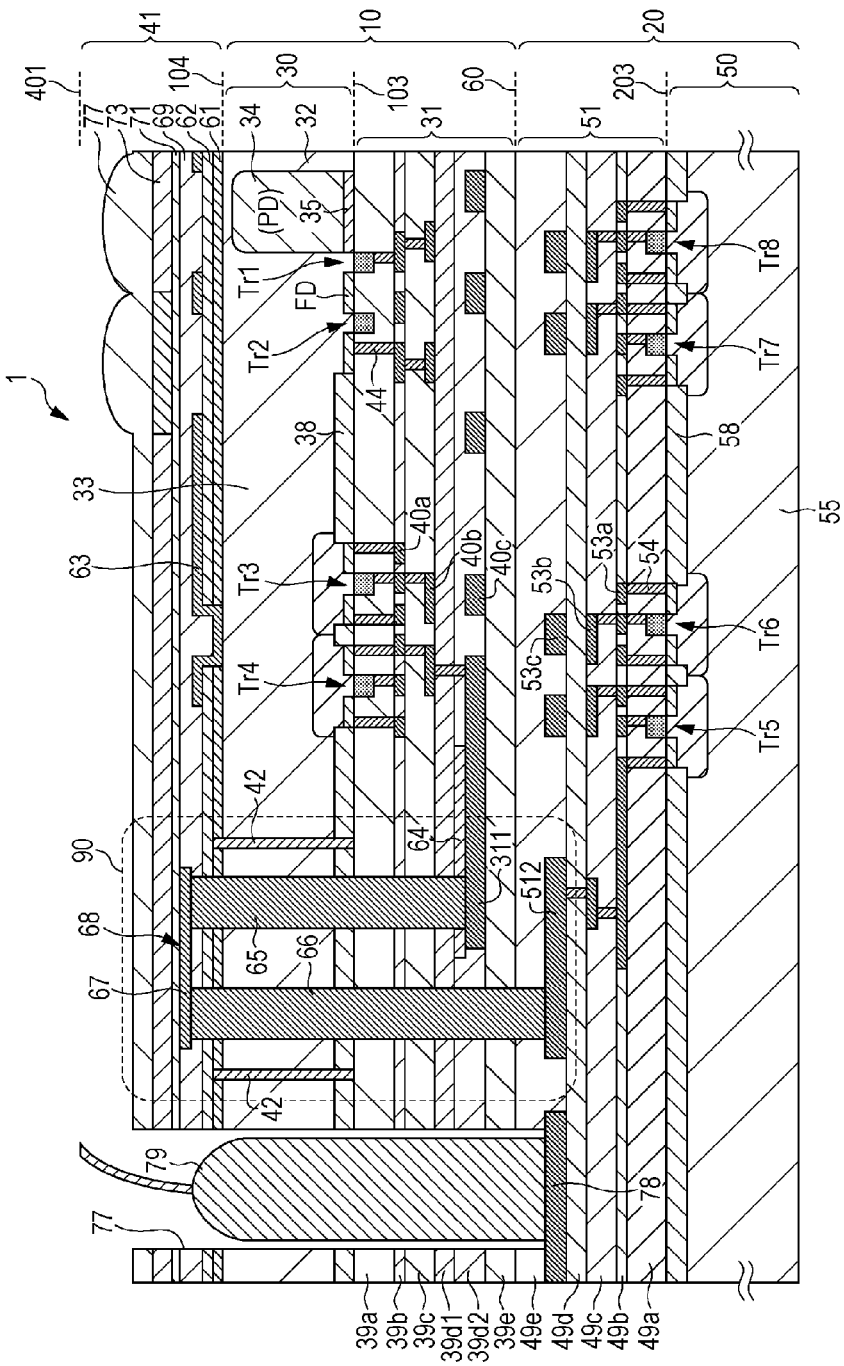
FIG. 2 is a schematic illustration showing the example of the semiconductor apparatus.

Next, the detail of an example of the semiconductor device 1 is described with reference to FIG. 2. FIG. 2 is a sectional view of the semiconductor device 1 in a plane containing points P and Q indicated in FIG. 1A. FIG. 2 illustrates the example including the control unit 12 like FIG. 1B.

In the following description, it is assumed that a conductor layer is made of a material with a higher conductivity than that of a semiconductor layer, and an insulator layer is made of a material with a lower conductivity than that of the semiconductor layer.

Also, in the following description for a semiconductor compound and a metal compound, a carbonitride and an oxynitride are included in a nitride, and a nitrocarbide and an oxycarbide are included in a carbide.

First, configurations of the first element part 30 and the first wiring part 31 of the first section 10 are described.

The first element part 30 includes a first semiconductor layer 33. The first semiconductor layer 33 is, for example, a silicon layer. The first element part 30 includes a photodiode PD that is a photoelectric conversion element and is provided at the first semiconductor layer 33, as a semiconductor element forming the photoelectric conversion unit 11 in FIG. 1B. The photodiode PD includes an n-type semiconductor region 34 and a p-type semiconductor region 35 in the first semiconductor layer 33. The first semiconductor layer 33 also has a p-type semiconductor region 32. The photoelectric conversion element may be a photogate. The signal generation circuit, which may be included in the photoelectric conversion unit 11, may be formed of a semiconductor element such as a metal oxide semiconductor (MOS) transistor or the like. FIG. 2 shows a transfer transistor Tr1 having a floating diffusion FD and a reset transistor Tr2 of the photoelectric conversion unit 11. Also, FIG. 2 shows transistors Tr3 and Tr4 as semiconductor elements of the control unit 12 shown in FIG. 1B.

In this example, a portion of a surface 103 of the first semiconductor layer 33 forming the first element part 30 forms an interface with a gate insulating film of the MOS transistors Tr1, Tr2, Tr3, and Tr4. The first element part 30 has an element isolator 38 by, for example, shallow trench isolation (STI) or local oxidation of silicon (LOCOS). The first element part 30 has a first protection film (not shown) formed of an insulator layer, such as silicon nitride or silicon oxide. The first protection film protects the surface 103 of the first semiconductor layer 33. As described above, the first element part 30 may include the element isolator 38, the gate insulating film, a gate electrode, and the first protection film, in addition to the first semiconductor layer 33.

The first wiring part 31 includes a conductor layer and an insulator layer. The first wiring part 31 may have a plurality of wiring levels. A wiring level may have a wiring pattern and a plug. A typical conductor layer forms a wiring pattern. Further, a typical conductor layer forms a main conductive layer with a relatively high current density among the wiring patterns. Also, a typical conductor layer may form an auxiliary conductive layer with a lower current density than that of the main conductive layer among the wiring patterns. The conductor layer may have a via plug for obtaining electrical connection with a lower wiring level (a wiring level of a semiconductor layer), or a contact plug for obtaining electrical connection with the first element part 30.

The via plug and the contact plug may also include the main conductive layer and the auxiliary conductive layer. The auxiliary conductive layer is typically barrier metal. A barrier function of the barrier metal may be a barrier against diffusion between the main conductive layer and the insulator layer, or a barrier against reaction between the main conductive layer and the insulator layer. However, "barrier metal" is a name given to the auxiliary conductive layer for the convenience of understanding, and may not have a barrier function. Even if barrier metal does not need such a barrier function, the barrier metal may be used simply as a base when the main conductive layer is formed, and to reduce electromigration or stressmigration.

The insulator layer may function as an inter-wiring insulating layer that provides insulation between wiring patterns with the same wiring level, and/or an interlayer insulating layer that provides insulation between wiring patterns with different wiring levels. The first wiring part 31 has multiple electric paths (wiring) with two or more wiring levels. Single wiring may include a contact plug, a via plug, and a wiring pattern.

The detailed configuration of the first wiring part 31 is described. The first wiring part 31 includes a contact plug 44, wiring patterns 40a, 40b, and 40c, and via plugs corresponding to the wiring patterns 40b and 40c. The contact plug, the wiring patterns, and the via plugs formed of the conductor layers form multiple electric paths. The contact plug 44 is mainly formed of a tungsten layer, and has barrier metal including a titanium layer and/or a titanium nitride layer, in addition to the tungsten layer. The wiring patterns 40a, 40b, and 40c, and the via plugs are each mainly formed of a copper layer, and each have barrier metal including a tantalum nitride layer and/or a tantalum layer, in addition to the copper layer. The wiring pattern 40a is formed of a single copper layer. The wiring pattern 40b and the wiring pattern 40c are integrally formed of a single copper layer with the corresponding via plug. First wiring 311 of this example includes the wiring pattern 40c and is connected with the transistor Tr4, which is the semiconductor element provided at the first element part 30, through the contact plug 44, the wiring patterns 40a and 40b and the via plugs.

The first wiring part 31 includes insulator layers 39a, 39b, 39c, 39d1, 39d2, and 39e each serving as an interlayer insulating layer or an inter-wiring insulating layer and made of silicon oxide. The insulator layer 39b is an inter-wiring insulating layer for the wiring pattern 40a. The insulator layers 39a, 39b, 39c, and 39d are located between the wiring pattern 40c and the first semiconductor layer 33. The wiring pattern 40c is located between the insulator layer 39e and the first semiconductor layer 33. The first wiring part 31 may further include insulator layers (not shown) made of silicon nitride, silicon carbide, or the like, as diffusion prevention layers for copper contained in the wiring patterns 40a, 40b, and 40c. The insulator layers may be each arranged between the interlayer insulating layer and the wiring pattern. The diffusion prevention layer may have a smaller thickness than that of the interlayer insulating layer or the inter-wiring insulating layer.

Next, configurations of the second element part 50 and the second wiring part 51 of the second section 20 are described.

The second element part 50 includes a second semiconductor layer 55, and has MOS transistors Tr5, Tr6, Tr7, and Tr8 serving as semiconductor elements forming the signal processing unit 22. In this example, a portion of a surface 203 of the second semiconductor layer 55 forms an interface with a gate insulating film of the MOS transistors Tr5, Tr6, Tr7, and Tr8. The second element part 50 has an element isolator 58 by, for example, STI or LOCOS. The second element part 50 has a second protection film (not shown) formed of an insulator, such as silicon nitride or silicon oxide. The second protection film protects the surface 203 of the second semiconductor layer 55. The second element part 50 may include the element isolator 58, the gate insulating film, a gate electrode, and the second protection film, in addition to the second semiconductor layer 55.

The second wiring part 51 includes a conductor layer and an insulator layer. The conductor layer and the insulator layer of the second wiring part 51 have functions similar to the conductor layer and the insulator layer of the first wiring part 31.

The detailed configuration of the second wiring part 51 is described. The second wiring part 51 includes a contact plug 54, a plurality of wiring patterns 53a, 53b, and 53c, and via plugs corresponding to the wiring patterns 53b and 53c. The contact plug, the wiring patterns, and the via plugs formed of the conductor layers form multiple electric paths. The contact plug 54 and the via plug corresponding to the wiring pattern 53c are each mainly formed of a tungsten layer, and each have barrier metal including a titanium layer and/or a titanium nitride layer, in addition to the tungsten layer. The wiring patterns 53a and 53b, and the via plug corresponding to the wiring pattern 53b are each mainly formed of a copper layer, and each have barrier metal including a tantalum nitride layer and/or a tantalum layer, in addition to the copper layer. The wiring pattern 53a includes a single copper layer. The wiring pattern 53b and the corresponding via plug are integrally formed of a single copper layer. The wiring pattern 53c is mainly formed of an aluminum layer, and has barrier metal including a titanium layer and/or a titanium nitride layer, in addition to the aluminum layer. Second wiring 512 of this example includes the wiring pattern 53c and is connected with the transistor Try, which is the semiconductor element provided at the second element part 50, through the contact plug 54, the wiring patterns 53a and 53b, and the via plugs.

The second wiring part 51 includes insulator layers 49a, 49b, 49c, 49d, and 49e each serving as an interlayer insulating layer or an inter-wiring insulating layer, and made of silicon oxide. The insulator layer 49b is an inter-wiring insulating layer for the wiring pattern 53a. The insulator layers 49a, 49b, 49c, and 49d are located between the wiring pattern 53c and the second semiconductor layer 55. The wiring pattern 53c is located between the insulator layer 49e and the second semiconductor layer 55. The second wiring part 51 may further include insulator layers (not shown) made of silicon nitride or silicon carbide, as diffusion prevention layers for copper contained in the wiring patterns 53a and 53b. The insulator layers may be each arranged between the interlayer insulating layer and the wiring pattern.

In the wiring patterns 40a, 40b, 40c, 53a, and 53b, and the plugs. The copper layer, the tungsten layer, and the aluminum layer in the wiring patterns 40a, 40b, 40c, 53a, and 53b, and the plugs function as main conductive layers with relatively high conductivities among the wiring. Each main conductive layer is made of a material with a higher conductivity and a larger sectional area in a current flow direction than those of the auxiliary conductive layers, such as the tantalum layer, the tantalum nitride layer, the titanium layer, and the titanium nitride layer used for the barrier metal.

In the example, the wiring patterns 40a, 40b, 40c, 53a, and 53b are mainly formed of the copper layers; however, wiring patterns mainly formed of aluminum layers, such as the wiring pattern 53c, may be employed. The copper layer does not have to be made of only copper, and the aluminum layer does not have to be made of only aluminum. The copper layer and the aluminum layer may be made of alloys with other metal added. For example, the copper layer may contain aluminum or silicon as an additive by an amount smaller than the amount of copper. The aluminum layer may contain copper or silicon as an additive by an amount smaller than the amount of aluminum. In the example, the insulator layers 39a, 39b, 39c, 39d1, 39d2, 39e, 49a, 49b, 49c, 49d, and 49e are made of silicon oxide; however, may use silicate glass such as borosilicate glass (BSG), phosphosilicate glass (PSG), or borophosphosilicate glass (BPSG). Also, a material with a lower dielectric constant (a low-k material) than that of silicon oxide may be used.

In the example, the number of wiring levels of the first wiring part 31 is the three levels, and the number of wiring levels of the second wiring part 51 is the three levels. However, the number of wiring levels may be desirably set, and the number of levels for the first wiring part 31 may differ from the number of levels for the second wiring part 51. For example, the number of wiring levels for the second wiring part 51 may be larger than the number of wiring levels for the first wiring part 31.

Then, other structure of the semiconductor device 1 is described.

The first section 10 and the second section 20 are joined by the first wiring part 31 and the second wiring part 51. The insulator layer 39e of the first wiring part 31 and the insulator layer 49e of the second wiring part 51 are joined through a joining surface 60. Accordingly, the insulator layer 39e and the insulator layer 49e are located between the first wiring 311 and the second wiring 512 (between the wiring pattern 40c and the wiring pattern 53c).

The semiconductor device 1 of this example forms a backside-illumination photoelectric conversion apparatus in which a surface (a back surface 104) opposite to the surface (the surface 103) provided with the transistors Tr1 to Tr4 of the first semiconductor layer 33 serves as a light-receiving surface. In the backside-irradiation photoelectric conversion apparatus, the first semiconductor layer 33 of the first section 10 has a thickness smaller than 10 μm, and is, for example, in a range from 2 to 5 μm. The second semiconductor layer 55 has a larger thickness than that of the first semiconductor layer 33. The second semiconductor layer 55 may function as a supporting member for the first semiconductor layer 33. The second semiconductor layer 55 has a thickness of 10 μm or larger, and is, for example, in a range from 20 to 500 μm.

An optical member 41 is provided at the back surface 104 of the first semiconductor layer 33.

The optical member 41 includes an antireflection layer 61, an insulator layer 62, a light-shielding layer 63, an insulator layer 69, a planarization layer 71, a color filter (a color-filter array) 73, and an on-chip lens (a microlens array) 77. The optical member 41 contacts the back surface 104 of the first semiconductor layer 33, the back surface 104 forming the light-receiving surface of the first element part 30. A surface 401 of the optical member 41 opposite to the surface near the first element part 30 is a light incidence surface. In this example, the light incidence surface is formed of the on-chip lens 77.

An electrode pad 78 is arranged in the layer with the same level as the level of the wiring pattern 53c. An opening 77 is provided above the electrode pad 78. The opening 77 penetrates through the plurality of insulator layers, the first semiconductor layer 33, and the optical member 41. The opening 77 is provided with a bonding wire 79 connected to the electrode pad 78. The bonding wire 79 is connected to an internal terminal of the package. The connection between the semiconductor device 1 and the package is not limited to the wire bonding connection and may use flip-chip connection.

The semiconductor device 1 is provided with a conductive member 68 that mutually connects the first wiring 311 and the second wiring 512. The conductive member 68 of this embodiment includes a first through part 65, a second through part 66, and a coupling part 67 that connects the through parts.

The first through part 65 penetrates through the first element part 30 and is connected with the first wiring 311 of the first wiring part 31. The second through part 66 penetrates through the first element part 30 and the first wiring part 31, and is connected with the second wiring part 51 of the second section 20. The first through part 65 penetrates through the first element part 30, however, does not penetrate through the first wiring part 31. Hence, the first through part 65 does not penetrate through the first section 10. In contrast, the second through part 66 penetrates through the first element part 30 and the first wiring part 31, and hence penetrates through the first section 10. The first through part 65, the second through part 66, and the coupling part 67 are made of a conductive material to attain electrical connection between the first wiring 311 and the second wiring 512. However, the first through part 65, the second through part 66, and the coupling part 67 may be made of a plurality of kinds of conductive materials.

Another form of the conductive member 68 may be a form in which the first through part 65 and the second through part 66 are integrated. For such a form, see a through connection conductor (84) depicted in FIG. 15 of Japanese Patent Laid-Open No. 2010-245506, and an inter-substrate wiring (80) depicted in FIG. 21 of Japanese Patent Laid-Open No. 2011-096851.

Also, in this example, the first through part 65 contacts the wiring pattern 40c, and the second through part 66 contacts the wiring pattern 53c. However, it is not limited thereto. The first through part 65 may contact one or a plurality of the wiring patterns 40a, 40b, and 40c. The second through part 66 may contact one or a plurality of the wiring patterns 53a, 53b, and 53c. Also, the first through part 65 and the second through part 66 may contact a conductive layer (a copper layer or an aluminum layer) of a wiring pattern, or may contact a barrier metal layer (a titanium layer, a titanium nitride layer, or a tantalum layer) of a wiring pattern. Also, either through part may penetrate through a conductor layer of barrier metal of a wiring pattern, and contact a conductor layer.

The conductive member 68 is surrounded by an insulating region 42 provided in the first semiconductor layer 33. The insulating region 42 may be a gas region or a vacuum region. The conductive member 68 provides electrical connection between the photoelectric conversion unit 11 and the signal processing unit 22, between the photoelectric conversion unit 11 and the control unit 21, and between the control unit 12 and the signal processing unit 22. A block 90 shown in FIG. 2 indicates a region including the conductive member 68, the first wiring 311, the second wiring 512, and the insulating region 42 relating to the connection between the sections. A plurality of the blocks 90 may be arranged in parallel. If the plurality of blocks 90 are arranged in parallel, signals per column or signals per row of the photoelectric conversion unit 11 can be handed to the signal processing unit 22, and the signal processing unit 22 can process the electric signals based on a signal carrier generated in the photoelectric conversion unit 11. Alternatively, the blocks 90 may be arranged in series, or may be arranged in series and in parallel.

Described above is the example of the configuration of the semiconductor device 1. The configuration may be properly modified.

The relationship between the conductive member 68 and the first wiring part 31 is described below in detail.

In the first wiring part 31 of this embodiment, an intermediate layer 64 is provided in the periphery of the conductive member 68. The intermediate layer 64 is located between the wiring pattern 40c of the first wiring 311, which contacts the first through part 65 of the conductive member 68, among the first wiring 311, and the insulator layer 39d1. The intermediate layer 64 of this embodiment is an insulator layer; however, the intermediate layer 64 may be a conductor layer. The intermediate layer 64 is made of a material different from the material of the insulator layer 39d1. The insulating material used for the intermediate layer 64 may be silicon nitride or silicon carbide, whereas the insulator layer 39d1 is made of silicon oxide. The conductive material used for the intermediate layer 64 may be titanium, titanium nitride, tantalum, or tantalum nitride. If the intermediate layer 64 is the insulator layer, the first through part 65 penetrates through the intermediate layer 64 and contacts the wiring pattern 40c. If the intermediate layer 64 is the conductor layer, the first through part 65 may not penetrate through the intermediate layer 64 and may contact the intermediate layer 64. In this case, the intermediate layer 64 is located between the copper layer (the conductive layer) of the wiring pattern 40c and the first through part 65. Alternatively, the first through part 65 may penetrate through the intermediate layer 64, which is the conductor layer, and contact the copper layer (the conductive layer) of the wiring pattern 40c. If the first through part 65 penetrates through the intermediate layer 64, the first through part 65 may contact a side surface of the intermediate layer 64.

In this example, the intermediate layer 64 is provided only at a position directly above the wiring pattern 40c of the first wiring 311. Hence, the intermediate layer 64 does not extend to a partial region (a non-present region), which is located between the wiring pattern 53c of the second wiring 512 and the insulator layer 39d1 and which contacts the second through part 66 of the conductive member 68. However, as long as the intermediate layer 64 does not extend to the partial region between the insulator layer 39d1 and the wiring pattern 53c of the second wiring 512, the intermediate layer 64 may extend to a region between the wiring pattern 53c in wiring other than the second wiring 512 and the insulator layer 39d1. The second through part 66 does not typically contact the intermediate layer 64. However, the second through part 66 may occasionally contact the intermediate layer 64.

The intermediate layer 64 functions as a protection layer that protects the wiring pattern 40c when the conductive member 68 is formed during manufacturing of the semiconductor device 1.

Figures 1, 3A:
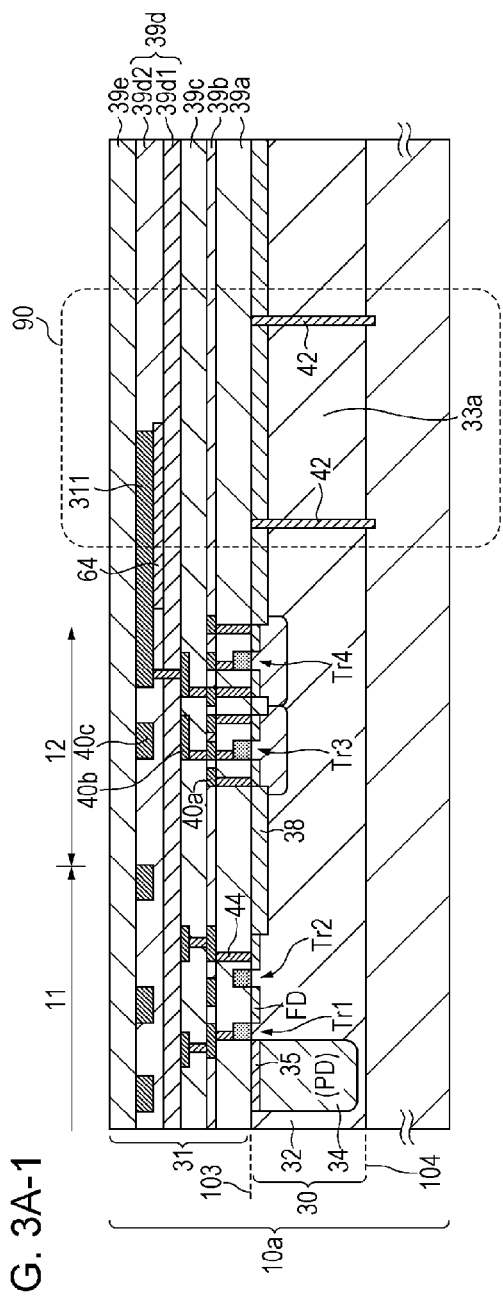
Figures 2, 3A:
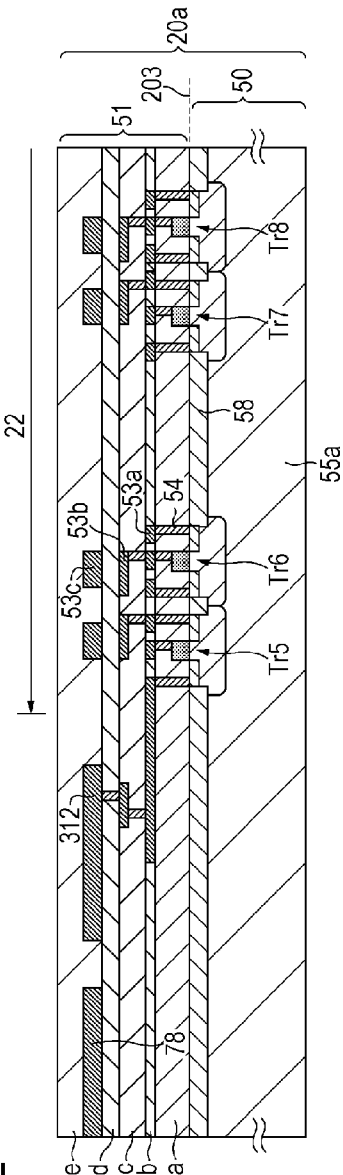

A manufacturing method of the semiconductor apparatus is described with reference to FIGS. 3A-1, 3A-2, 3B, 4C, 4D, 5E, and 5F. FIGS. 3A-1 to 5F are sectional views showing a part similar to FIG. 2 (a plane containing the points P and Q in FIG. 1A).

A manufacturing process of a first component 10a, which becomes the first section 10, is described with reference to FIG. 3A-1.

First, the first element part 30 is formed. Specific description is given below. A first semiconductor substrate 33a, which becomes the first semiconductor layer 33, is prepared. The first semiconductor substrate 33a is, for example, a silicon substrate. The insulation region 42, which isolates a desirable region of the first semiconductor substrate 33a, is formed. The insulating region 42 is formed at a position surrounding the conductive member 68 in FIG. 2. The insulating region 42 is formed to a depth below the lower surface (the back surface) 104 of the first semiconductor layer 33 in FIG. 2. The insulating region 42 is formed by making an opening at the desirable position of the upper surface (the front surface) 103 of the first semiconductor substrate 33a from the upper surface, and embedding an insulating material in the opening. Alternatively, the insulating region 42 may be formed by forming a deep trench at the desirable position of the upper surface (the front surface) 103 of the first element part 30 from the upper surface, and capping the deep trench, so that at least a portion of the trench becomes hollow.

Then, the element isolator 38 is formed on the upper surface (the surface) 103 of the first semiconductor substrate. Then, wells for the transistors Tr3 and Tr4 are formed in the first semiconductor substrate. Then, the n-type semiconductor region 34 and the p-type semiconductor region 35 for the photoelectric conversion unit, and an n-type semiconductor region and a p-type semiconductor region for the transistors Tr1, Tr2, Tr3, and Tr4 are formed. Also, the gate electrode is formed on the first semiconductor substrate through a gate oxide film. Then, a first protection film (not shown) that protects the surface 103 of the first semiconductor substrate is formed to cover the gate electrode. In this way, the first element part 30 is formed.

Then, the first wiring part 31 is formed on the first element part 30. Specific description is given below. First, the insulator layer 39a is formed on the first semiconductor substrate 33a through the first protection film, and a contact hole is formed in the first protection layer and the insulator layer 39a. Then, for example, a titanium film with a thickness of 5 nm, a titanium nitride film with a thickness of 10 nm, and a tungsten film with a thickness of 300 nm are successively deposited. By removing excessive portions of the films outside the contact hole by chemical mechanical planarization (CMP) or the like, the contact plug 44 is formed.

Then, the insulator layer 39b is formed, and a groove (a trench) for single damascene is formed in the insulator layer 39b. Then, for example, a tantalum film with a thickness of 10 nm and a copper seed film with a thickness of 100 nm are successively deposited, and hence, for example, a copper-plated film with a thickness of 900 nm is formed. By removing excessive portions of the films outside the trench by CMP or the like, the wiring pattern 40a is formed. Then, a diffusion prevention layer (not shown) made of, for example, a silicon nitride layer or a silicon carbide layer, is deposited by a thickness of 50 nm.

Then, the insulator layer 39c is formed as an interlayer insulating layer, and a hole (a via) for dual damascene is formed in the insulator layer 39c by patterning. The groove (the via) has dimensions, for example, a width of 150 nm, and a depth of 300 nm. Then, a groove (a trench) for dual damascene is formed in the insulator layer 39c by patterning. Then, for example, a tantalum film with a thickness of 10 nm and a copper seed film with a thickness of 100 nm are deposited, and hence, for example, a copper-plated film with a thickness of 900 nm is formed. Then, by removing excessive portions of the films located outside the trench, the via plug and the wiring pattern 40b are integrally formed. Then, a cap layer (not shown) with a thickness of 50 nm is deposited. Similarly, the insulator layers 39d and 39e are formed, and the via plug and the wiring pattern 40c are integrally formed by the dual damascene method.

At this time, the intermediate layer 64 is formed before the formation of the via plug and the wiring pattern 40c. The insulator layer 39d1 made of silicon oxide is formed, and then an intermediate film, which becomes the intermediate layer 64, is formed on the insulator layer 39d1. The intermediate film is made of the material of the intermediate layer 64, such as silicon nitride. By patterning this intermediate film, the intermediate layer 64 is formed. In the patterning, a portion located between a portion in which the first through part 65 is formed in a later process and the wiring pattern 40c of the first wiring 311 is left. In contrast, in the patterning, a portion located between a portion in which the second through part 66 is formed in a later process and the wiring pattern 53c of the second wiring 512 is removed. The intermediate layer 64 is formed as described above, and then the insulator layer 39d2 made of silicon oxide etc. is formed. A hole (a via) for dual damascene is formed in the insulator layer 39d1 (and the insulator layer 39d2), and a groove (a trench) for dual damascene is formed in the insulator layer 39d2. If the intermediate layer 64 has a larger area than the area of the trench, the intermediate layer 64 may serve as an etching stopper during the formation of the trench. Then, a tantalum film and a copper film are formed, and excessive portions of the films are removed by CMP or the like. Then, the insulator layer 39e made of silicon oxide is formed.

In this way, the first component 10a including the first element part 30 and the first wiring part 31 is obtained.

A manufacturing process of a second component 20a, which becomes the second section 20, is described with reference to FIG. 3A-2.

First, the second element part 50 is formed. Specific description is given below. First, a second semiconductor substrate 55a, which becomes the second semiconductor layer 55, is prepared. The second semiconductor substrate 55a is, for example, a silicon substrate. The element isolator 58 is formed on the upper surface (the surface) 203 of the second semiconductor substrate. Then, wells for the transistors Tr5, Tr6, Tr7, and Tr8 are formed in the second semiconductor substrate. Then, an n-type semiconductor region and a p-type semiconductor region for the transistors Tr5, Tr6, Tr7, and Tr8 are formed. Also, the gate electrode is formed on the second semiconductor substrate through a gate oxide film. Then, a second protection film (not shown) that protects the surface 203 of the second semiconductor substrate is formed to cover the gate electrode. In this way, the second element part 50 is formed.

Then, the second wiring part 51 is formed on the upper surface (the surface) 203 of the second element part 50. The contact plug 54 and the via plug may be formed similarly to the contact plug 44. The wiring pattern 53a may be formed similarly to the wiring pattern 40a. The wiring pattern 53b and the via plug may be formed similarly to the wiring pattern 40b and the via plug. The wiring pattern 53c may be formed by patterning a laminated body of a titanium layer and/or a titanium nitride layer, an aluminum layer, and a titanium layer and/or a titanium nitride layer.

In this way, the second component 20a including the second element part 50 and the second wiring part 51 is obtained. Any of the first component 10a and the second component 20a may be fabricated first, or both the first component 10a and the second component 20a may be fabricated simultaneously.

Figure 3B:
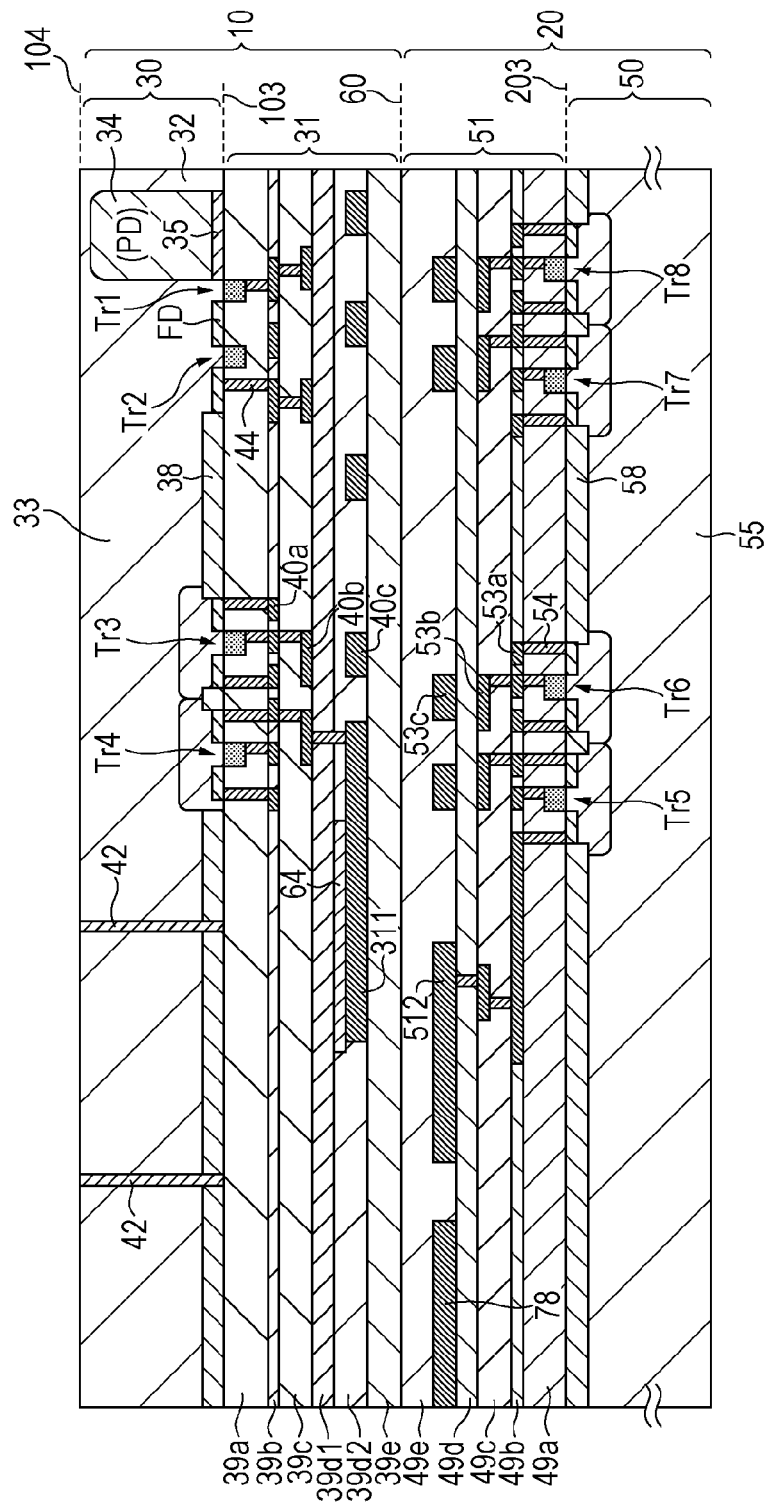

The description is given with reference to FIG. 3B. The first component 10a and the second component 20a are prepared as described above, and the first component 10a and the second component 20a are joined so that the first wiring part 31 and the second wiring part 51 are located between the first element part 30 and the second element part 50. The joining can be provided by plasma joining at the planarized insulator layer 39b and insulator layer 49b, and metal joining between the metal layers of copper etc. exposed to the surfaces of the first wiring part 31 and the second wiring part 51 or adhering using an adhesive layer. The insulator layer 39e of the first wiring part 31 and the insulator layer 49e of the second wiring part 51 are located between the wiring pattern 40c of the first wiring 311 and the wiring pattern 53c of the second wiring 512.

Further, the first semiconductor substrate of the first element part 30 of the first component 10a after the joining is reduced in thickness from a lower surface (a back surface). The thickness may be reduced by, for example, polishing, CMP, or etching. By reducing the thickness to the surface 104, the first section 10 including the first element part 30 having the first semiconductor layer 33, which is the configuration of FIG. 3B, can be obtained. By reducing the thickness of the first semiconductor layer 33, incident light efficiently reaches the photoelectric conversion unit 11. This contributes to an increase in sensitivity.

In this way, the laminated body including the first section 10 and the second section 20 is obtained. The first section 10 includes the first element part 30 having the first semiconductor layer 33. Also, the first section 10 includes the first wiring part having the conductor layer (the main conductive layer or the auxiliary conductive layer) of the wiring pattern 40c and the insulator layer 39d1 located between the first semiconductor layer 33 and the main conductive layer. Further, the first wiring part 31 has the intermediate layer 64, which is made of the material different from the materials of the insulator layer 39d1 and the wiring pattern 40c, and which is located between the insulator layer 39d1 and the conductor layer of the wiring pattern 40c. The second section 20 includes the second element part 50 having the second semiconductor layer 55. Also, the second section 20 includes the second wiring part 51 having the conductor layer (the main conductive layer) of the wiring pattern 53c. In the laminated body, the second wiring part 51 is located between the first element part 30 and the second element part 50. Also, the first wiring part 31 is located between the first element part 30 and the second wiring part 51. Also, the insulator layer 39e and the insulator layer 49e are located between the conductor layer of the wiring pattern 40c and the conductor layer of the wiring pattern 53c.

Figure 4C:
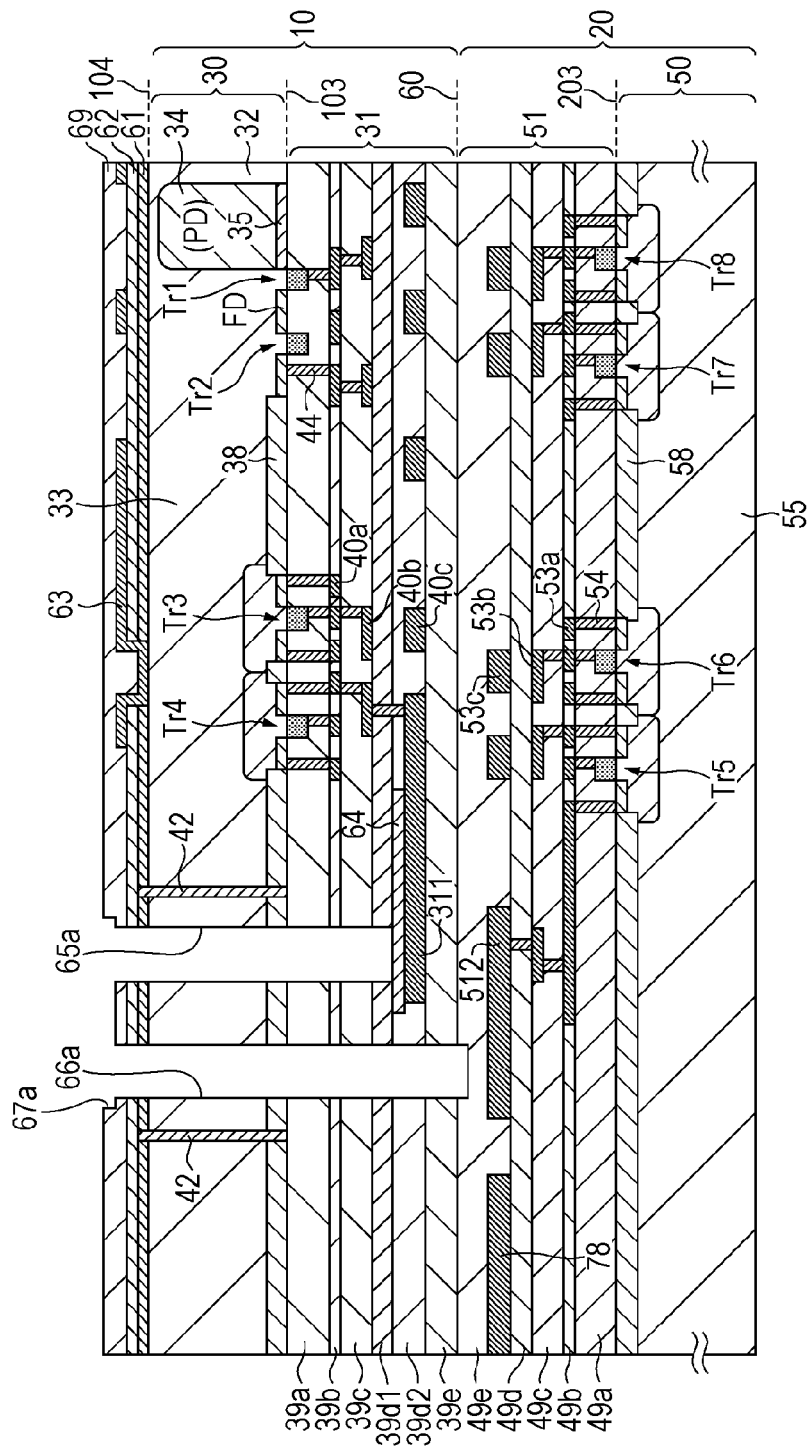
FIGS. 4C and 4D are schematic illustrations showing the example of the manufacturing method of the semiconductor apparatus.

The description is given with reference to FIG. 4C. The antireflection layer 61 and the insulator layer 62 are formed on the surface 104 of the first semiconductor layer 33 with the reduced thickness. Then, the light-shielding layer 63 is formed. The antireflection layer 61 may have a refractive index between refractive indices of a silicon layer and a silicon oxide layer. The antireflection layer 61 may be formed of, for example, silicon nitride. A plurality of the antireflection layers 61 may be provided. The insulator layer 62 is made of, for example, silicon oxide. The light-shielding layer 63 may be formed by depositing aluminum or tungsten, and performing patterning. The light-shielding layer 63 may be arranged between pixels, on an optical black pixel, and on an element that is affected by incidence of light. Before the light-shielding layer 63 is deposited, by patterning the anti-reflection layer 61 and the insulator layer 62 and then depositing the light-shielding layer 63, the light-shielding layer 63 and the first element part 30 may be brought into electrical connection.

Further, the insulator layer 69 is formed on the insulator layer 62 and the light-shielding layer 63. The insulator layer 69 is formed of, for example, a silicon oxide film. Then, a desirable region of the insulator layer 69 inside the insulating region 42 is patterned, and hence a coupling groove 67a is formed. The coupling groove 67a is formed, for example, by a depth not to reach the first element part 30.

Then, a first through hole 65a directed to the wiring pattern 40c of the first wiring 311, and a second through hole 66a directed to the wiring pattern 53c of the second wiring 512 are formed at the bottom surface of the coupling groove 67a. The first through hole 65a and the second through hole 66a each have dimensions of, for example, a width in a range from 1 to 3 µm, and a depth in a range from 3 to 8 µm. The first through hole 65a and the second through hole 66a have depths several times larger than those of the via plugs formed in the first wiring part 31 and the second wiring part 51. The distance between the first through hole 65a and the second through hole 66a may be in a range from 1 to 10 µm. If the distance between the first through hole 65a and the second through hole 66a is small, it is difficult to form the groove. In contrast, if the distance is large, the chip area may increase. Hence, an optimal distance is set. The first through hole 65a and the second through hole 66a are formed by etching the first section 10 (the first element part 30 and the first wiring part 31). The etching method may be dry etching such as reactive ion etching (RIE). The same etching can be employed for the formation of the first through hole 65a and the formation of the second through hole 66a. The formation of the first through hole 65a and the formation of the second through hole 66a may be individually performed. However, in this embodiment, the formation of the first through hole 65a and the formation of the second through hole 66a are performed simultaneously. With this embodiment, the presence of the intermediate layer 64 allows the damage on the first wiring 311 to be reduced when the first through hole 65a is formed. At this time, the intermediate layer 64 protects the first wiring 311 even if the second through hole 66a is formed simultaneously.

In the following explanation, "the etching method" is classified according to the principle of etching. For example, wet etching and dry etching are different etching methods, and plasma etching and sputter etching are different etching methods. The etching method is not different even if "an etching condition" is different. For example, RIEs with different kinds of reactive gas are the same etching methods, but have different etching conditions. This can be applied to the flow rate of gas, the pressure of gas, and the temperature. Plasma etching and sputter etching also have different etching conditions.

The first through hole 65a is formed by etching the insulator layer 69, the insulator layer 62, the antireflection layer 61, the first semiconductor layer 33, the element isolator 38, the first protection film of the first wiring part 31, and the insulator layers 39a, 39b, 39c, and 39d1 of the first wiring part 31. When the first through hole 65a penetrates through the insulator layer 39d1, the intermediate layer 64 is located between the first through hole 65a and the wiring pattern 40c of the first wiring 311. In the etching of the insulator layer 39d1 at this time employs an etching condition that the etching rate for the material (silicon oxide) of the insulator layer 39d1 is higher than the etching rate for the intermediate layer 64 made of the material (silicon nitride) different from silicon oxide. Owing to this, the etching rate is decreased when the first through hole 65a penetrates through the insulator layer 39d1 and reaches the intermediate layer 64 in the formation step of the first through hole 65a. However, the intermediate layer 64 may not be etched under this condition. The insulator layer 39d1 is etched under an etching condition that the etching selectivity of the insulator layer 39d1 to the intermediate layer 64, that is, (the etching rate of the insulator layer 39d1)/ (the etching rate of the intermediate layer) is larger than 1. The etching selectivity may be preferably 10 or larger. To obtain such an etching selectivity, for example, in case of RIE, the high-frequency power, gas type, gas flow rate, gas pressure, temperature, etc., may be properly set.

The second through hole 66a is formed by etching the insulator layer 69, the insulator layer 62, the antireflection layer 61, the first semiconductor layer 33, the element isolator 38, the first protection film of the first wiring part 31, and the insulator layers 39a, 39b, 39c, and 39d1 of the first wiring part 31. When the second through hole 66a penetrates through the insulator layer 39d1, the intermediate layer 64 is not present between the second through hole 66a and the wiring pattern 53c of the second wiring 512. In other words, the second through hole 66a is formed through the non-presence region of the intermediate layer 64. Hence, after the second through hole 66a penetrates through the insulator layer 39d1, like the formation of the first through hole 65a, the etching on the insulator layer 39d2 progresses while the etching rate is not decreased.

Further, when the etching progresses and the second through hole 66a penetrates through the insulator layer 39e made of silicon oxide, the state in which the intermediate layer 64 is located between the first through hole 65a and the wiring pattern 40c of the first wiring 311 may be maintained.

That is, when the second through hole 66a penetrates through the insulator layer 39e made of silicon oxide, the first through hole 65a does not penetrate through the intermediate layer 64. However, the intermediate layer 64 may be reduced in thickness by etching.

Figure 4D:
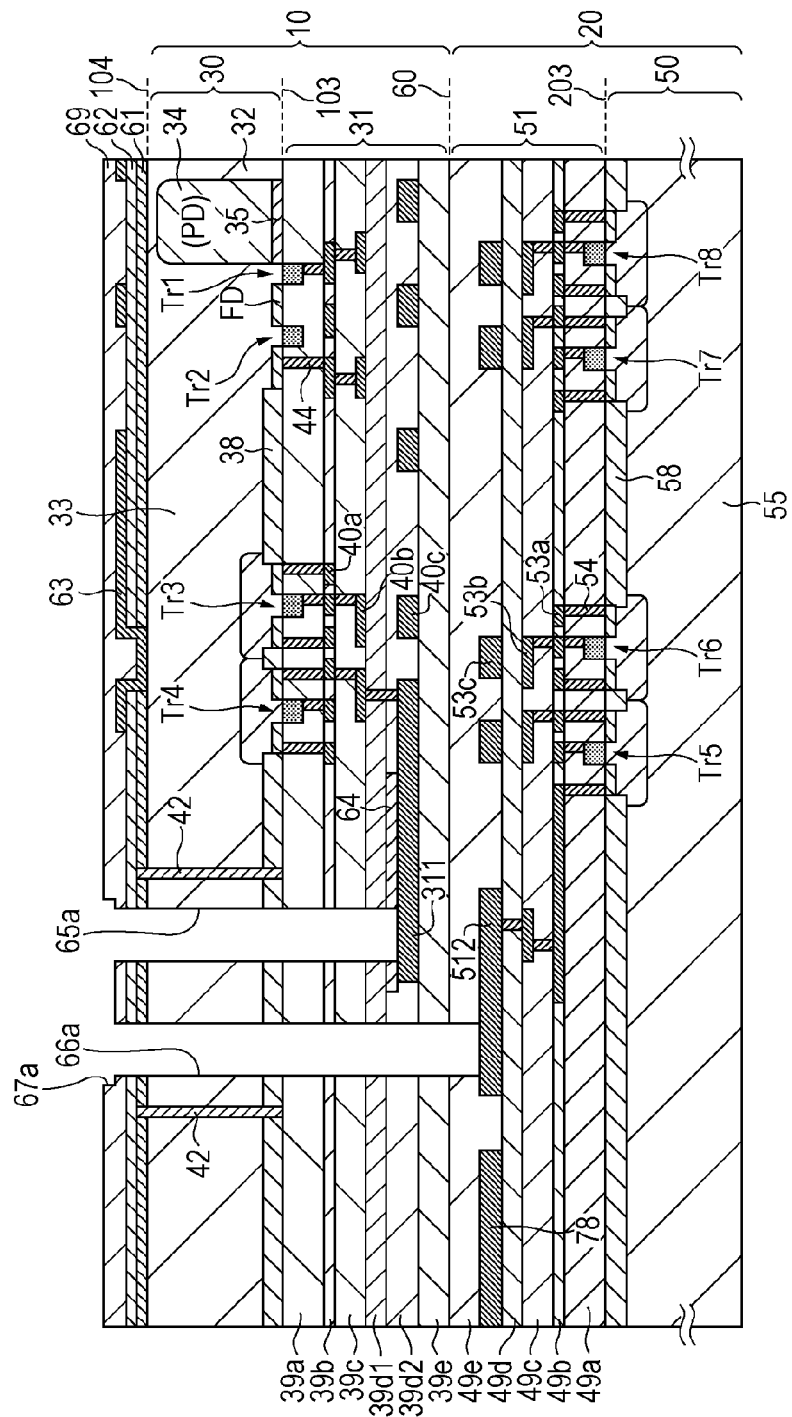

The description is given with reference to FIG. 4D. The etching is further continued under the same condition, or the etching is continued while the etching condition is changed, so that the first through hole 65a reaches the wiring pattern 40c of the first wiring part 31 and the second through hole 66a reaches the wiring pattern 53c of the second wiring part 51.

If the intermediate layer 64 is used as described above, the first through hole 65a and the second through hole 66a with different depths can be formed simultaneously. In contrast, the first through hole 65a and the second through hole 66a may be individually patterned and etched. If the first through hole 65a and the second through hole 66a can be formed simultaneously, as compared with a case in which the first through hole 65a is formed and then the second through hole 66a is formed, the number of steps for patterning and etching can be reduced, and a process regarding the difference in depth of the first through hole 65a is not required. That is, when the second through hole 66a is patterned, if the first through hole 65a is present, a step of embedding a certain material in the first through hole 65a and planarizing the first through hole 65a is required. This is because, if the certain material is not embedded in the first through hole 65a and the second through hole 66a is patterned, a phenomenon called striation in which a film-thickness difference of a photoresist is radially generated from the first through hole 65a. If the film thickness of the photoresist is uneven, the pattern dimensions may vary, and fine processing may not be performed. Further, a residue or the like may occasionally affect the image quality of the photoelectric conversion apparatus.

As described above, since the intermediate layer 64 is provided between the insulator layer 39d1 and the wiring pattern 40c, at the side of the wiring pattern 40c to which the first through hole 65a is connected, the through hole penetrating through the insulator layer 39d1 can be stably formed. The reason is as follows. The first through hole 65a is formed to penetrate through the first semiconductor layer 33 and to be connected with the wiring pattern 40c of the first wiring layer. For the formation of the first through hole 65a, the insulator layer 69, the insulator layer 62, and the antireflection layer 61 formed at the back surface 104 side of the first semiconductor layer 33 are etched first. The total film thickness of the insulator layer 69, the insulator layer 62, and the antireflection layer 61 is about 1 µm. Next, the first semiconductor layer 33 is etched. The film thickness of the first semiconductor layer 33 is typically in a range from 2 to 5 µm. Then, the first wiring part 31 is etched to the wiring pattern 40c. The film thickness of the first wiring part 31 to the wiring pattern 40c is in a range from 1 to 5 µm, and for example, about 3 µm. Accordingly, the depth of the first through hole 65a is in a range from 4 to 11 µm. In the case of FIG. 2, the depth is in a range from 6 to 9 µm. Also, the diameter of the first through hole 65a is several micrometers. If such a deep hole is made in the multi-layer film, the differences among the film thicknesses of the respective layers are added, and the film-thickness difference among the etching-target films are increased depending on the position. Etching may be insufficient depending on the position due to the film-thickness difference, and the opening may not be correctly made. To perform etching to the conductor layer, if a portion of wiring is excessively etched, the wiring may be damaged, and a connection failure may occur or reliability of the wiring may be degraded. Also, the wiring material or an organic material containing the wiring material may be scattered when the wiring is etched, and wiring lines, which should be separated, may be short-circuited. For example, if the insulator layer 39d in FIG. 2 is an organic-based insulating film and the wiring pattern 40c in FIG. 2 is copper-based metal wiring, etching uses oxidative active species. In the final phase of etching, the metal wiring surface exposed to the bottom of the through hole is exposed to the oxidative active species, and is oxidized. If the overetching time is increased, the oxidization of the metal wiring progresses accordingly. In this state, a contact resistance may be abnormally increased, or a connection failure may occur. Also, for example, the total thickness from the insulator layer 69, the insulator layer 62, the antireflection layer 61, the first semiconductor layer 33, and the wiring pattern 40c of the first wiring part 31, which are the etching-target films, is in a range from 6 to 9 µm. In contrast, the thickness of the wiring pattern 40c to which the first through hole 65a is connected is several hundreds of nanometers. Hence, the first through hole 65a may penetrate through the wiring pattern 40c depending on the overetching time, and the contact resistance may be abnormally increased or the connection failure may occur. Also, for example, if the overetching time is increased, the wiring pattern 40c is hit with ions. Hence, the scattered amount of copper forming the wiring pattern 40c may be increased, the scattered copper may adhere to the side wall of the first through hole 65a, and the copper may be diffused in the first wiring part 31. The diffused copper portion decreases the resistance, resulting in a short-circuit between wiring lines.

In this embodiment, the intermediate layer 64, which is the film made of the material different from the material of the insulator layer 39d, is provided at the side of the wiring pattern 40c to which the first through hole 65a is connected. The material and etching condition of the intermediate layer 64 are set so that there is a large difference between the etching rate of the intermediate layer 64 and the etching rate of the insulator layer 39d1, which is the etching-target film. Etching is performed up to the intermediate layer 64 first, so that all the etching-target films having the film-thickness differences are etched and only the intermediate layer 64 is left. If the intermediate layer 64 is the conductor layer, the intermediate layer 64 does not have to be etched. If the intermediate layer 64 is the insulator layer, the etching condition is changed and the intermediate layer 64 is etched. Accordingly, even if the etching-target films have the film-thickness differences, the through hole, which penetrates through the semiconductor layer, can be stably formed. In this case, the film thickness of the intermediate layer 64 may be appropriately set in accordance with expected film-thickness differences of the etching-target films and the etching-rate differences with respect to the etching-target films.

Figure 5E:
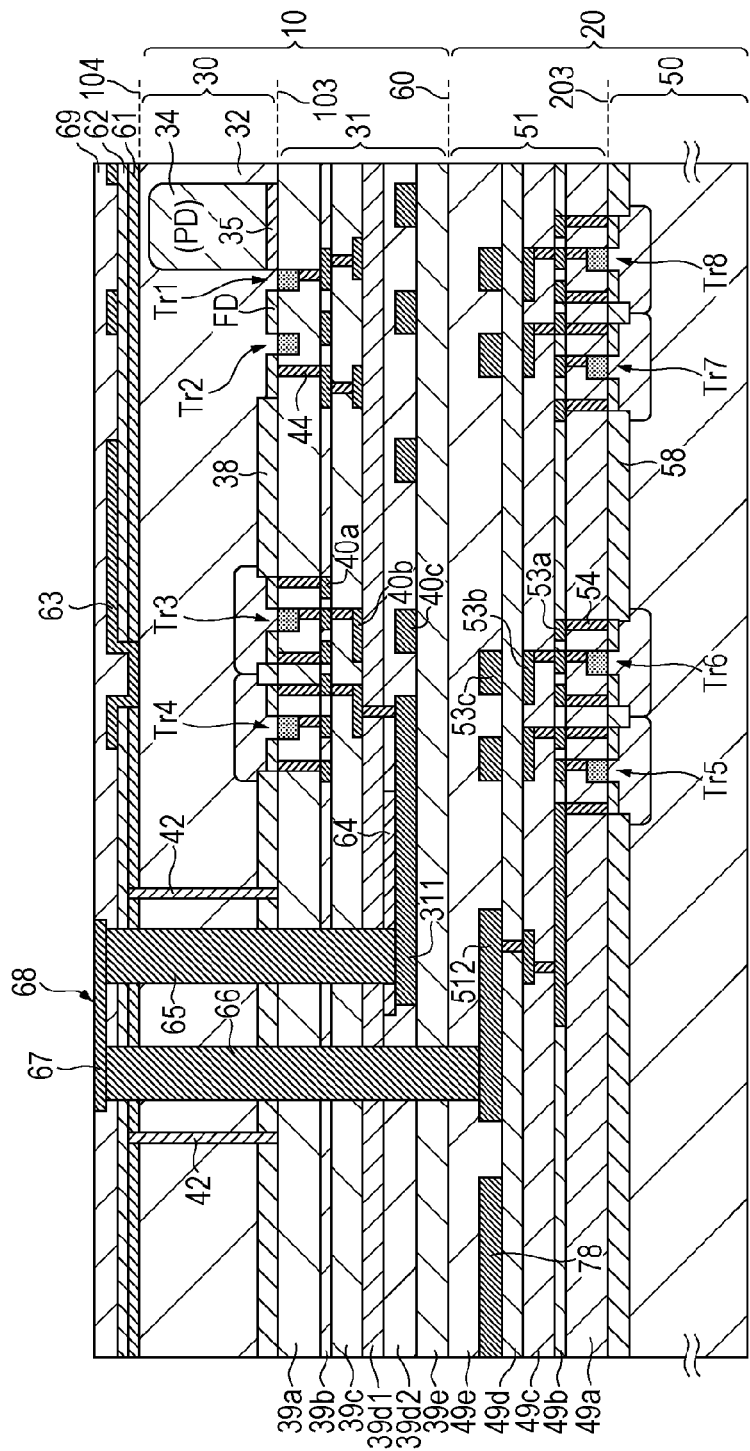
FIGS. 5E and 5F are schematic illustrations showing the example of the manufacturing method of the semiconductor apparatus.
Figure 5F:
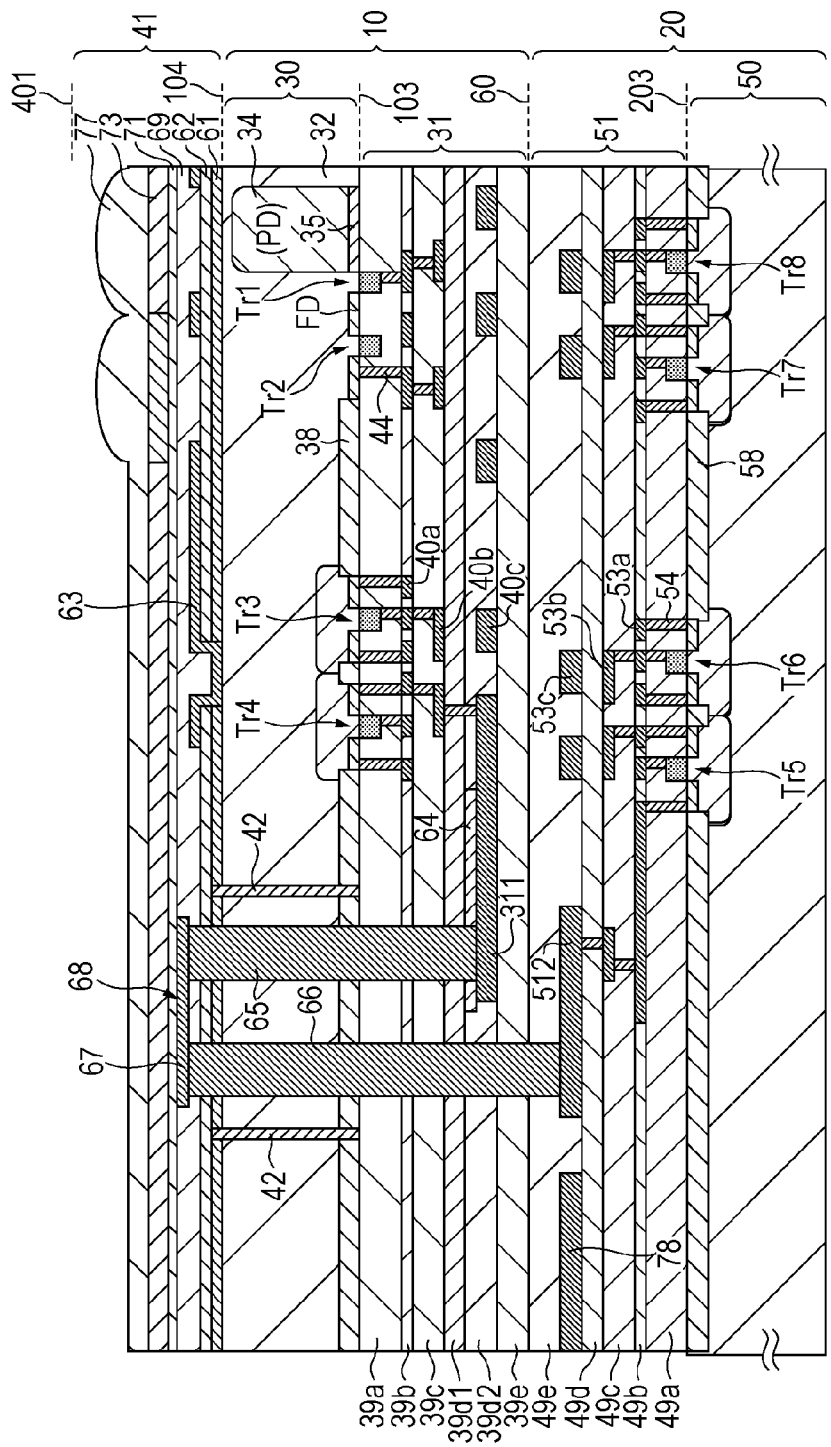

The manufacturing method is described with reference to FIG. 5E. A conductive material is embedded in the first through hole 65a, the second through hole 66a, and the coupling groove 67a. The conductive material may be a conductive material with a high conductivity, such as tungsten, gold, silver, copper, or aluminum. Barrier metal may be formed if required before the film formation of the conductive material. In this example, the conductive material uses tungsten, and the barrier metal may use a titanium nitride layer and/or a titanium layer. The barrier metal of the conductive member 68 may contact the first wiring 311 and the second wiring 512. In this way, the first through part 65, the second through part 66, and the coupling part 67 are formed.

By removing excessive portion of the conductive material, the first through part 65, the second through part 66, and the coupling part 67 are formed. Also, the first through part 65, the second through part 66, and the coupling part 67 form the conductive member 68. Accordingly, the wiring pattern 40c of the first wiring part 31 of the first section 10 is electrically connected with the wiring pattern 53c of the second wiring part 51 of the second section 20. Also, in this embodiment, the conductive member 68 is formed within the insulating region 42 formed in the first element part 30, and hence the conductive member 68 is prevented from being electrically connected with the first element part 30.

In the formation step of the conductive member 68 of this embodiment, the dual damascene method of simultaneously embedding the conductive material in the first through hole 65a, the second through hole 66a, and the coupling groove 67a is used. However, it is not limited thereto, and the single damascene method may be used. For example, the first through hole 65a and the second through hole 66a may be formed first, the conductive material may be simultaneously embedded in the first through hole 65a and the second through hole 66a, then the coupling groove 67a may be formed, and the conductive material may be embedded in the coupling groove 67a. Also, for the dual damascene method, the example of trench first is described, in which the coupling groove 67a is formed and then the first through hole 65a and the second through hole 66a are formed. However, via first may be employed, in which the first through hole 65a and the second through hole 66a are formed first, and then the coupling groove 67a is formed. Also, the formation of the coupling part 67 is not limited to the damascene method, and may be formed by patterning a conductive film of, for example, aluminum. For example, a via plug mainly made of tungsten is formed in an insulating layer formed on the first through part 65 and the second through part 66, and an aluminum film covering the insulating layer and the via plug is patterned by etching. Accordingly, the coupling part 67 formed of the via plug and the aluminum layer may be formed. At this time, a barrier formed of a titanium layer and/or a titanium nitride layer may be provided between the tungsten layer serving as the via plug and the insulating layer. Also, barrier metal formed of a titanium layer and/or a titanium nitride layer may be provided at an upper layer and/or a lower layer of the aluminum layer.

Various modifications may be made as long as the conductive member 68, in which the wiring pattern 40c of the first wiring part 31 of the first section 10 is electrically connected with the wiring pattern 53c of the second wiring part 51 of the second section 20, is formed. For example, the method of obtaining the electrical connection is not limited to the embedment of the conductive material into the through hole, and the electrical connection between the conductor layers may be obtained through conductive thin films formed along the side wall of the through hole.

The description is given with reference to FIG. 5F. The planarization layer 71 may be formed of a plurality of films, such as inorganic insulator films or organic insulator films. Also, the planarization layer 71 may be appropriately planarized. Next, the color filter 73 and the on-chip lens 77 formed of resin are formed on the planarization layer 71 in that order.

Then, the opening 77 is formed in the electrode pad 78. Accordingly, the configuration in FIG. 2 is obtained. In this embodiment, the formation step of the opening 77 is after the color filter 73 and the on-chip lens 77 are formed. However, the opening 77 may be formed before the color filter 73 and the on-chip lens 77 are formed. After the color filter 73 and the on-chip lens 77 are formed, heat treatment at high temperatures (about 400° C.) cannot be performed, for protection of the color filter 73 and the on-chip lens 77 made of resin. If the semiconductor device 1 is damaged by the processing for the opening 77, heat treatment may be occasionally required for recovery of the damage. The order of processes may be properly changed.

Then, the semiconductor device 1 is bonded to the package by die bonding. Then, the bonding wire 79 for connection with the electrode pad 78 is formed in the opening 77. The package is sealed with a transparent plate. A land grid array (LGA), which is an external terminal of the package, is fixed to a circuit board by reflow soldering.

In this embodiment, the example is provided in which the intermediate layer 64 contacts the wiring pattern 40c of the first wiring 311. The distance between the intermediate layer 64 and the wiring pattern 40c of the first wiring 311 may be as small as possible. However, the intermediate layer 64 may be separated from the wiring pattern 40c of the first wiring 311. Also, the insulator layer (the first insulator layer), which is a comparison subject of the etching rate as an index of selection for the material of the intermediate layer 64, is the insulator layer 39d1, which contacts the intermediate layer 64. The first insulator layer may be the insulator layers 39a, 39b, and 39c as long as the insulator layers 39a, 39b, and 39c are insulator layers of the first wiring part 31, through which the first through hole 65a and the second through hole 66a penetrate. However, the distance between the intermediate layer 64 and the first insulator layer may be preferably as small as possible, and the first insulator layer may be more preferably the insulator layer 39d1, which contacts the intermediate layer 64. In this case, the intermediate layer 64 may be located between the insulator layer serving as the index and the wiring pattern 40c of the first wiring 311. For example, the intermediate layer 64 may be located between two insulator layers selected from the insulator layers 39a, 39b, 39c, and 39d. Also, a plurality of intermediate layers (layers which are located below the first through hole 65a but not located below the second through hole 66a) may be provided. The intermediate layers are formed to cause the formation speed (proportional to the etching rate) of the first through hole 65a to be lower than the formation speed of the second through hole 66a.

The intermediate layer may also serve as a diffusion preventing film for copper, the film which is provided to correspond to the wiring patterns 40a and 40b containing the copper layers. For example, two silicon nitride layers are provided respectively between the insulator layer 39b and the insulator layer 39c and between the insulator layer 39c and the insulator layer 39d1, which are the silicon oxide layers. The silicon nitride layers are formed to have openings surrounding a portion in which the second through hole 66a is formed. The silicon nitride layers are located between the first through hole 65a and the wiring pattern 40c of the first wiring 311. Then, the first through hole 65a is formed by using the etching method of etching the silicon oxide layers more than the silicon nitride layers. Accordingly, the silicon nitride layers may function as the intermediate layer of this embodiment.

If the first element part 30 is located between the first wiring part 31 and the second element part 50, the first through hole 65a and the second through hole 66a penetrate through the first insulator layer, and then only the second through hole 66a among the first through hole 65a and the second through hole 66a penetrates through the first semiconductor layer 33. If the intermediate layer is located between the first insulator layer and the first wiring, the intermediate layer can restrict the damage on the first wiring.

Second Embodiment

A semiconductor apparatus according to a second embodiment and a manufacturing method of the semiconductor apparatus are described with reference to FIGS. 6A to 6D. FIGS. 6A to 6D correspond to the sectional surface of the block 90 in FIG. 2. The matters not described here may be similar to those of the first embodiment.

Figures 6A, 6B:
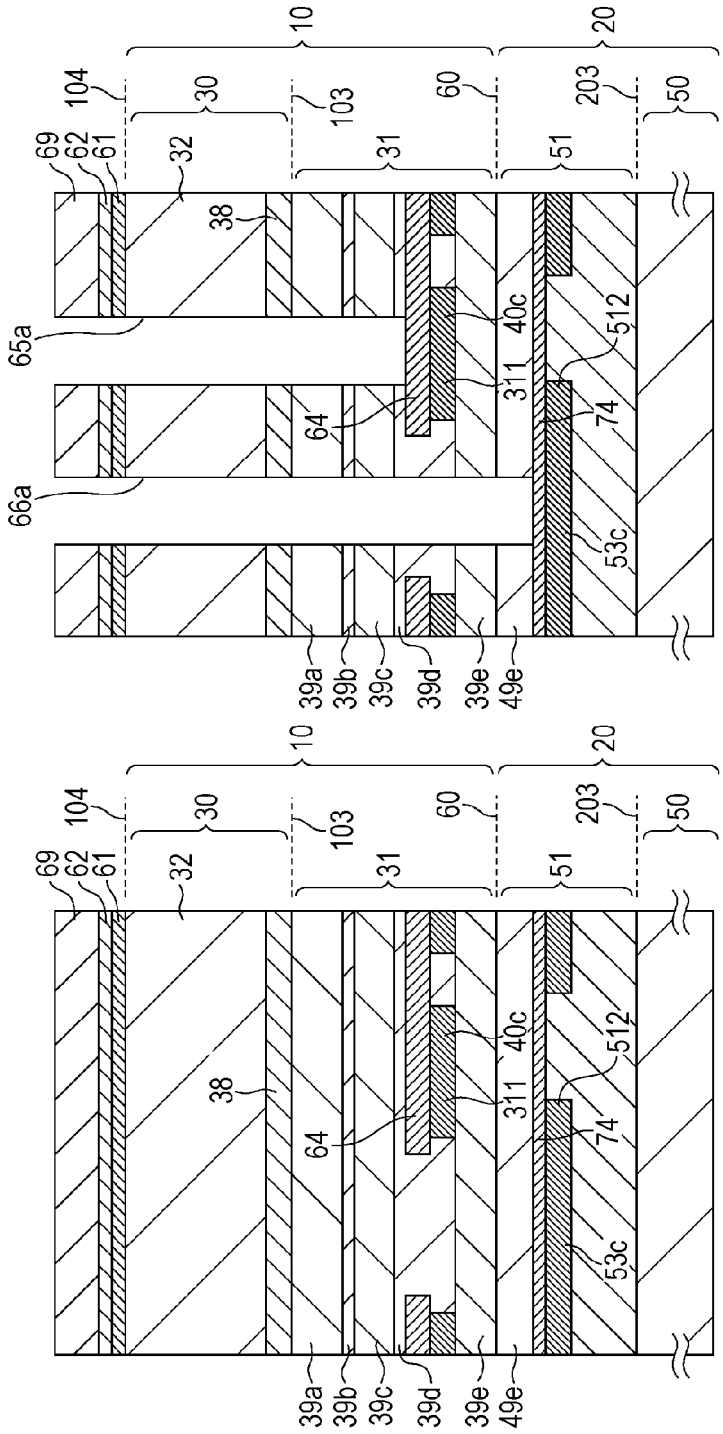

As shown in FIG. 6A, in the second embodiment, an intermediate layer 74 is provided at the wiring pattern 53c of the second wiring part 51 of the second section 20, at the side where the second through part 66 is formed. The intermediate layer 74 in this example is an insulator layer; however, the intermediate layer 74 may be a conductor layer. Also, in the second embodiment, the intermediate layer 64 formed at the wiring pattern 40c of the first wiring part 31, at the side where the first through part 65 is formed, is removed in a region in which the second through hole 66a is formed and does not extend to that region. The intermediate layer 64 is formed to have a larger thickness than the thickness of the intermediate layer 74. However, the intermediate layer 74 may have a larger thickness than the thickness of the intermediate layer 64, or the thicknesses may be the same.

As shown in FIG. 6B, patterning is performed from the surface of the insulator layer 69 at the second surface (the back surface) side of the first semiconductor layer 33, and hence the openings of the first through hole 65a and the second through hole 66a are formed. The intermediate layer 64 reduces the etching of the first through hole 65a, and the intermediate layer 74 reduces the etching of the second through hole 66a. In the second embodiment, since the intermediate layer 74 is provided at the wiring pattern 53c of the second wiring part 51 of the second section 20, at the side where the second through part 66 contacts. The wiring pattern 53c is not excessively etched, and the through hole penetrating through the semiconductor layer may be stably formed.

As shown in FIG. 6C, the insulator film is deposited by chemical vapor deposition (CVD) or the like, at the second surface (the back surface) side of the first semiconductor layer 33. Then, etch back is performed on the insulator layer from the second surface (the back surface) side of the first semiconductor layer 33. Accordingly, the insulator film at the bottoms of the first through hole 65a and the second through hole 66a and located above the intermediate layers 64 and 74 is removed. Then, an insulating region 75 is formed at the side surfaces of the first through hole 65a and the second through hole 66a. The insulating region 75 may be formed of a silicon oxide film or a silicon nitride film.

As shown in FIG. 6C, the etching is further continued under the same condition, or the etching is continued while the etching condition is changed, so that the first through hole 65a reaches the wiring pattern 40c of the first wiring part 31 and the second through hole 66a reaches the wiring pattern 53c of the second wiring part 51. Thus, the first through hole 65a and the second through hole 66a with different depths can be formed simultaneously. In contrast, the first through hole 65a and the second through hole 66a may be individually patterned and etched. If the first through hole 65a and the second through hole 66a can be formed simultaneously, as compared with a case in which the first through hole 65a is formed and then the second through hole 66a is formed, the number of steps for patterning and etching can be reduced, and a process regarding the difference in depth of the first through hole 65a is not required. The intermediate layer 64 and the intermediate layer 74 may have different layer thicknesses. For example, if the materials of the intermediate layer 64 and the intermediate layer 74 are the same, the thickness of the intermediate layer 64 may be larger than the thickness of the intermediate layer 74, by taking into account the amount of etching of the intermediate layer 64 in a period from when the first through hole 65a reaches the intermediate layer 64 to when the second through hole 66a reaches the intermediate layer 74.

In this embodiment, the insulating region 75 is arranged on the side walls of the first through part 65 and the second through part 66, the side walls which contact the first semiconductor layer 33. Accordingly, the conductive material of the conductive member 68 is prevented from being electrically connected with the first semiconductor layer 33 while the area occupied by the block 90 is decreased.

The formation and etch back of the insulator film, which becomes the insulating region 75, may be performed before the first through hole 65a and the second through hole 66a penetrate through the intermediate layers 64 and 74. Accordingly, the damage on the wiring patterns 40c and 53c due to the etch back on the insulator film is restricted. Alternatively, the formation and etch back of the insulator film, which becomes the insulating region 75, may be performed after the first through hole 65a and the second through hole 66a penetrate through the intermediate layers 64 and 74 to cause the wiring patterns 40c and 53c to be exposed.

Third Embodiment

A semiconductor apparatus according to a third embodiment and a manufacturing method of the semiconductor apparatus are described with reference to FIGS. 7A to 7D. FIGS. 7A to 7D correspond to the sectional structure of the block 90 in FIG. 2. The matters not described here may be similar to those of the first embodiment. In the third embodiment, the intermediate layer is a conductor.

The description is given with reference to FIG. 7A. The intermediate layer 64 and the intermediate layer 74 according to the third embodiment are conductors. The intermediate layers 64 and 74 are each at least one of a titanium layer, a titanium compound layer, a tantalum layer, and a tantalum compound layer. The conductive layers of the wiring patterns 40c and 53c are each at least one of an aluminum layer and a tungsten layer. In this example, the intermediate layer 64 is a tantalum layer, the conductive layer of the wiring pattern 40c is a copper layer, the intermediate layer 74 is a laminated body of a titanium nitride layer and a titanium layer, and the conductive layer of the wiring pattern 53c is an aluminum layer. The intermediate layer 64 is arranged between the wiring pattern 40c and the insulator layer 39d. The intermediate layer 74 is arranged between the wiring pattern 53c and the insulator layer 39d.

The description is given with reference to FIG. 7B. Patterning is performed from the surface of the insulator layer 69 at the second surface (the back surface) side of the first semiconductor layer 33, and hence the openings are made for the coupling groove 67a, the first through hole 65a, and the second through hole 66a. At this time, the intermediate layer 64 decreases the formation speed of the first through hole 65a. In contrast, the second through hole 66a which is not affected by the intermediate layer 64 penetrates through the insulator layer 39e. The intermediate layer 64 is located between the first through hole 65a and the wiring pattern when the second through hole 66a penetrates through the insulator layer 39e. In this example, the first through hole 65a contacts the wiring pattern when the second through hole 66a penetrates through the insulator layer 39e; however, the first through hole 65a may be separated from the wiring pattern.

The description is given with reference to FIG. 7C. Etching on the insulator layer 49e is continued so that the second through hole 66a reaches the intermediate layer 74. The intermediate layer 64 is located between the first through hole 65a and the wiring pattern 40c when the second through hole 66a reaches the insulator layer 74. As described above, by providing the intermediate layers 64 and 74, the damage on the conductive layers (the copper layer and the aluminum layer) can be restricted when the first through hole 65a and the second through hole 66a are formed.

The description is given with reference to FIG. 7D. By forming a conductor such as copper in the first through hole 65a, the second through hole 66a, and the coupling groove 67a, the first through part 65, the second through part 66, and the coupling part 67 are formed. Also, the first through part 65, the second through part 66, and the coupling part 67 form the conductive member 68. Accordingly, the wiring pattern 40c (the copper layer) of the first wiring 311 of the first section 10 is electrically connected with the wiring pattern 53c (the aluminum layer) of the second wiring 512 of the second section 20. Also, in this embodiment, the conductive member 68 is formed within the insulating region 42 formed in the first semiconductor layer 33, and hence the conductive member 68 is prevented from being electrically connected with the first semiconductor layer 33. In the third embodiment, since the intermediate layer 64 and the intermediate layer 74 are the conductors, the first through hole 65a and the second through hole 66a do not have to penetrate through the intermediate layer 64 and the intermediate layer 74. The conductive member 68 can have electrical connection with the wiring pattern 40c (the copper layer) and the wiring pattern 53c (the aluminum layer) through the intermediate layer 64 and the intermediate layer 74.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-215969 filed Sep. 28, 2012, which is hereby incorporated by reference herein in its entirety.

What is claimed is:

1. A manufacturing method of a semiconductor apparatus, comprising:
   preparing a laminated body including:
   a first element part having a first semiconductor layer;
   a first wiring part having a first conductor layer, and a first insulator layer located between the first semiconductor layer and the first conductor layer;
   a second element part including a second semiconductor layer; and
   a second wiring part including a second conductor layer,
   wherein the second wiring part is located between the first element part and the second element part,
   wherein the first wiring part is located between the first element part and the second wiring part, and
   wherein a second insulator layer is located between the first conductor layer and the second conductor layer;
   forming a first hole, which penetrates through the first element part and the first insulator layer, from a side of the first semiconductor layer toward the first conductor layer, and forming a second hole, which penetrates through the first element part, the first wiring part, and the second insulator layer, from the side of the first semiconductor layer toward the second conductor layer; and
   forming a conductive member configured to electrically connect the first conductor layer with the second conductor layer, in the first hole and the second hole,
   wherein the first wiring part has an intermediate layer made of a material different from materials of the first insulator layer and the first conductor layer and located between the first insulator layer and the first conductor layer, and
   wherein an etching condition of the first insulator layer when the first hole is formed is that an etching rate for the material of the first insulator layer under the etching condition is higher than an etching rate for the material of the intermediate layer under the etching condition,
   wherein the second insulator layer is etched in the forming of the second hole, in a state where the first hole reaches the intermediate layer and the intermediate layer remains between the first hole and the first conductor layer.

2. The manufacturing method of the semiconductor apparatus according to claim 1, wherein the laminated body has a region where the intermediate layer does not extend between the second conductor layer and the first insulator layer, and the second hole passes through the region.

3. The manufacturing method of the semiconductor apparatus according to claim 1, wherein the second hole is formed by using an etching condition of the first insulator layer such that the intermediate layer remains between the first hole and the first conductor layer when the second hole penetrates through the first insulator layer.

4. The manufacturing method of the semiconductor apparatus according to claim 1, wherein the second hole is formed by using an etching condition of the second insulator layer such that the intermediate layer remains between the first hole and the first conductor layer when the second hole penetrates through the second insulator layer.

5. The manufacturing method of the semiconductor apparatus according to claim 1, wherein etching the first insulator layer for forming the first hole is simultaneously performed with etching the first insulator layer for forming the second hole.

6. The manufacturing method of the semiconductor apparatus according to claim 1, wherein the intermediate layer is an insulator layer, and the intermediate layer is etched under an etching condition different from the etching condition of the first insulator layer when the first hole is formed.

7. The manufacturing method of the semiconductor apparatus according to claim 1, wherein the intermediate layer contacts at least one of the first conductor layer and the first insulator layer.

8. The manufacturing method of the semiconductor apparatus according to claim 1,
   wherein the second wiring part includes a third insulator layer located between the second insulator layer and the second conductor layer and made of a material different from a material of the first insulator layer, and
   wherein the second hole is formed by using an etching condition such that the intermediate layer remains between the first hole and the first conductor layer when the second hole reaches the third insulator layer.

9. The manufacturing method of the semiconductor apparatus according to claim 8, wherein the intermediate layer has a larger thickness than a thickness of the third insulator layer.

10. The manufacturing method of the semiconductor apparatus according to claim 1, wherein the first insulator layer is a silicon oxide layer and the intermediate layer is a silicon nitride layer or a silicon carbide layer.

11. The manufacturing method of the semiconductor apparatus according to claim 1,
   wherein the intermediate layer is at least one of a titanium layer, a titanium compound layer, a tantalum layer, and a tantalum compound layer, and
   wherein the first conductor layer is at least one of a copper layer, an aluminum layer, and a tungsten layer.

* * * * *